(12) United States Patent
Yu et al.

(10) Patent No.: US 12,080,684 B2
(45) Date of Patent: Sep. 3, 2024

(54) DIE STACKS AND METHODS FORMING SAME

(71) Applicant: Taiwan Semiconductor Manufacturing Co., Ltd., Hsinchu (TW)

(72) Inventors: Chen-Hua Yu, Hsinchu (TW); Chung-Hao Tsai, Huatan Township (TW); Chuei-Tang Wang, Taichung (TW)

(73) Assignee: TAIWAN SEMICONDUCTOR MANUFACTURING COMPANY, LTD.

( * ) Notice: Subject to any disclaimer, the term of this patent is extended or adjusted under 35 U.S.C. 154(b) by 46 days.

(21) Appl. No.: 17/808,774

(22) Filed: Jun. 24, 2022

(65) Prior Publication Data
US 2022/0344306 A1    Oct. 27, 2022

Related U.S. Application Data

(60) Continuation of application No. 17/080,130, filed on Oct. 26, 2020, now Pat. No. 11,380,655, which is a
(Continued)

(51) Int. Cl.
*H01L 21/56* (2006.01)
*H01L 21/768* (2006.01)
(Continued)

(52) U.S. Cl.
CPC ........ *H01L 25/0657* (2013.01); *H01L 21/563* (2013.01); *H01L 21/566* (2013.01);
(Continued)

(58) Field of Classification Search
CPC . H01L 25/0657; H01L 21/563; H01L 21/566; H01L 21/76898; H01L 23/3128;
(Continued)

(56) References Cited

U.S. PATENT DOCUMENTS

| 7,550,857 B1 | 6/2009 | Longo et al. |
| 8,587,096 B2 | 11/2013 | Kim et al. |

(Continued)

FOREIGN PATENT DOCUMENTS

| CN | 106653705 A | 5/2017 |
| CN | 107768344 A | 3/2018 |

(Continued)

*Primary Examiner* — Elias Ullah
(74) *Attorney, Agent, or Firm* — Slater Matsil, LLP

(57) ABSTRACT

A method includes thinning a semiconductor substrate of a device die to reveal through-substrate vias that extend into the semiconductor substrate, and forming a first redistribution structure, which includes forming a first plurality of dielectric layers over the semiconductor substrate, and forming a first plurality of redistribution lines in the first plurality of dielectric layers. The first plurality of redistribution lines are electrically connected to the through-substrate vias. The method further includes placing a first memory die over the first redistribution structure, and forming a first plurality of metal posts over the first redistribution structure. The first plurality of metal posts are electrically connected to the first plurality of redistribution lines. The first memory die is encapsulated in a first encapsulant. A second plurality of redistribution lines are formed over, and electrically connected to, the first plurality of metal posts and the first memory die.

20 Claims, 33 Drawing Sheets

Related U.S. Application Data division of application No. 16/373,027, filed on Apr. 2, 2019, now Pat. No. 10,818,640.

(51) Int. Cl.
*H01L 23/00* (2006.01)
*H01L 23/31* (2006.01)
*H01L 23/48* (2006.01)
*H01L 23/522* (2006.01)
*H01L 23/528* (2006.01)
*H01L 25/065* (2023.01)

(52) U.S. Cl.
CPC .... *H01L 21/76898* (2013.01); *H01L 23/3128* (2013.01); *H01L 23/481* (2013.01); *H01L 23/5226* (2013.01); *H01L 23/5283* (2013.01); *H01L 24/09* (2013.01); *H01L 24/17* (2013.01); *H01L 24/32* (2013.01); *H01L 2224/0231* (2013.01); *H01L 2224/02373* (2013.01); *H01L 2224/02381* (2013.01); *H01L 2924/1434* (2013.01)

(58) Field of Classification Search
CPC ............ H01L 23/481; H01L 23/5226; H01L 23/5283; H01L 24/09; H01L 24/17; H01L 24/32; H01L 2224/0231; H01L 2224/02373; H01L 2224/02381; H01L 2924/1434; H01L 24/24; H01L 24/73; H01L 24/82; H01L 24/92; H01L 24/94; H01L 24/03; H01L 24/11; H01L 24/13; H01L 24/16; H01L 24/27; H01L 24/29; H01L 24/33; H01L 24/81; H01L 24/83; H01L 25/0652; H01L 2221/68377; H01L 2224/02379; H01L 2224/0401; H01L 2224/05624; H01L 2224/05644; H01L 2224/05647; H01L 24/19; H01L 24/20; H01L 24/97; H01L 2224/03002; H01L 2224/0391; H01L 2224/03912; H01L 2224/03914; H01L 2224/04105; H01L 2224/05008; H01L 2224/05569; H01L 2224/05655; H01L 2224/11002; H01L 2224/12105; H01L 2224/13022; H01L 2224/13024; H01L 2224/13025; H01L 2224/131; H01L 2224/13124; H01L 2224/13144; H01L 2224/13147; H01L 2224/13155; H01L 2224/16227; H01L 2224/16235; H01L 2224/1703; H01L 2224/17181; H01L 2224/24145; H01L 2224/24146; H01L 2224/27436; H01L 2224/2919; H01L 2224/32145; H01L 2224/32225; H01L 2224/33181; H01L 2224/73204; H01L 2224/73251; H01L 2224/82005; H01L 2224/83005; H01L 2224/83191; H01L 2224/92144; H01L 2224/9222; H01L 2224/94; H01L 2224/97; H01L 2225/06517; H01L 2924/15311; H01L 2924/1811; H01L 24/02; H01L 24/14; H01L 24/05; H01L 2224/02311; H01L 2224/02313; H01L 2224/0239; H01L 2224/034; H01L 2224/0345; H01L 2224/03462; H01L 2224/03464; H01L 2224/0347; H01L 2224/0361; H01L 2224/05082; H01L 2224/1146; H01L 2224/1147; H01L 2224/1411; H01L 2224/73267; H01L 2224/92244; H01L 23/3135; H01L 2225/06524; H01L 2225/06541; H01L 2225/06562; H01L 25/18; H01L 25/50; H01L 2221/68327; H01L 2221/68345; H01L 2221/68359; H01L 2225/06527; H01L 2225/06548; H01L 21/6835; H01L 21/50; H01L 21/56; H01L 23/3114; H01L 23/528; H01L 23/28; H01L 23/485; H01L 23/522; H01L 24/06; H01L 24/30; H01L 25/073

See application file for complete search history.

(56) References Cited

U.S. PATENT DOCUMENTS

| | | | |
|---|---|---|---|
| 9,837,289 | B2 | 12/2017 | Hu et al. |
| 10,096,574 | B2 | 10/2018 | Tsukiyama et al. |
| 10,170,341 | B1 | 1/2019 | Lin et al. |
| 10,368,442 | B2 | 7/2019 | Yu et al. |
| 10,522,526 | B2 | 12/2019 | Lai et al. |
| 10,692,789 | B2 | 6/2020 | Liu et al. |
| 11,373,969 | B2 | 6/2022 | Wu et al. |
| 2015/0303174 | A1* | 10/2015 | Yu ............... H01L 24/19 438/109 |
| 2016/0086902 | A1 | 3/2016 | Lu et al. |
| 2016/0358899 | A1 | 12/2016 | Lee et al. |
| 2017/0032977 | A1 | 2/2017 | Chen et al. |
| 2017/0098629 | A1 | 4/2017 | Liu et al. |
| 2018/0090457 | A1 | 3/2018 | Yu et al. |
| 2019/0096862 | A1 | 3/2019 | Yu et al. |

FOREIGN PATENT DOCUMENTS

| | | |
|---|---|---|
| DE | 102017117815 A1 | 3/2018 |
| JP | 2016063017 A | 4/2016 |
| KR | 20120036128 A | 4/2012 |
| TW | 201405753 A | 2/2014 |
| TW | 201705438 A | 2/2017 |
| TW | 201906095 A | 2/2019 |
| TW | 201911519 A | 3/2019 |

* cited by examiner

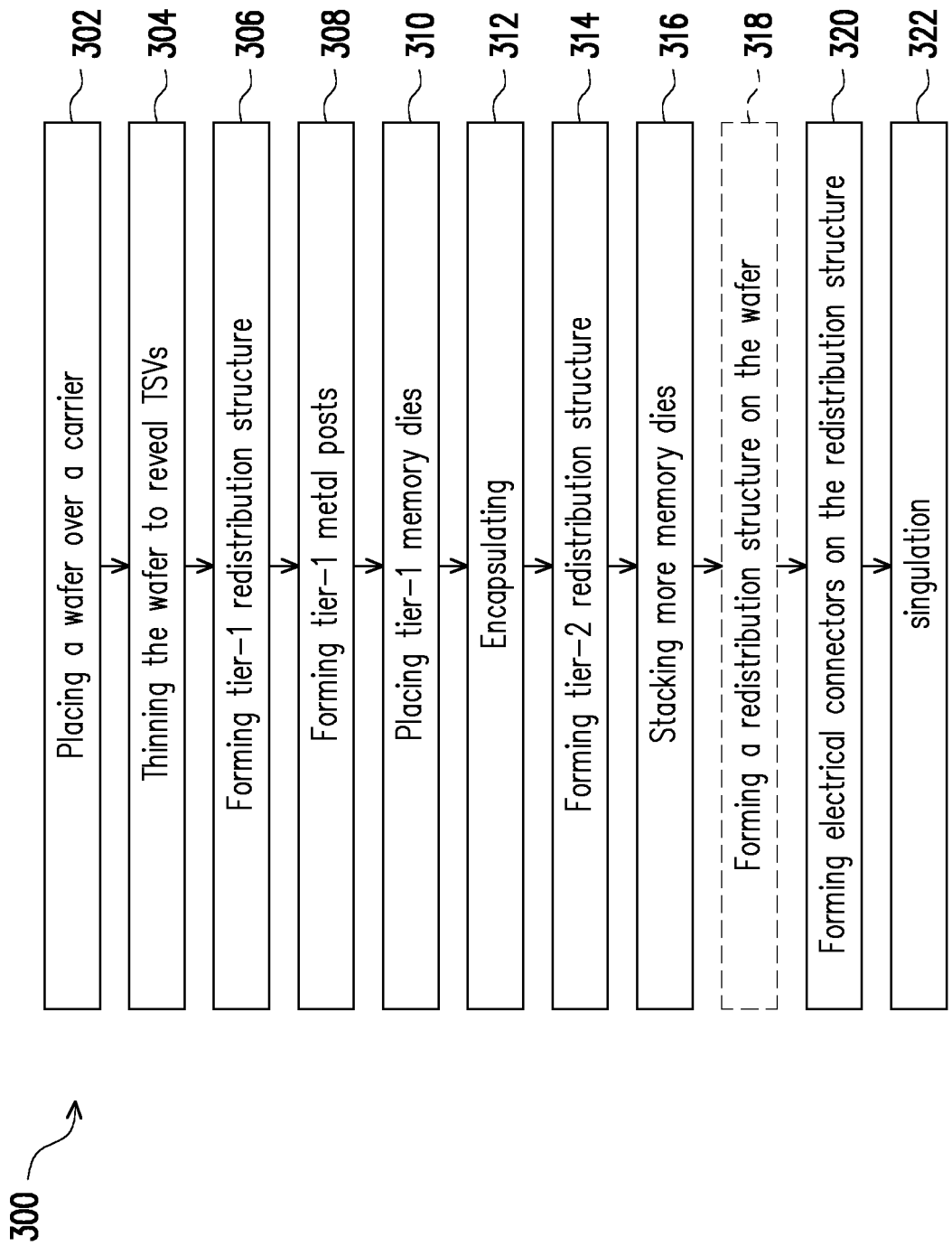

DIE STACKS AND METHODS FORMING SAME

PRIORITY CLAIM AND CROSS-REFERENCE

This application is a continuation of U.S. patent application Ser. No. 17/080,130, entitled "Die Stacks and Methods Forming Same," filed on Oct. 26, 2020, which is a divisional of U.S. patent application Ser. No. 16/373,027, entitled "Die Stacks and Methods Forming Same," filed on Apr. 2, 2019, now U.S. Pat. No. 10,818,640 issued Oct. 27, 2020, which applications are incorporated herein by reference.

BACKGROUND

A High-Performance Computing (HPC) system often includes a High-Bandwidth-Memory (HBM) stack bonded to a logic die. A HBM stack typically includes a plurality of memory dies stacked together, with higher memory dies bonded to the lower memory dies through solder bonding or metal direct bonding through micro bumps. Through-Silicon Vias (TSVs) are formed in the memory dies, so that upper dies may be electrically connected to the logic die through the TSVs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 33 illustrates a process flow for forming a die stack in accordance with some embodiments.

DETAILED DESCRIPTION

Figure 1:
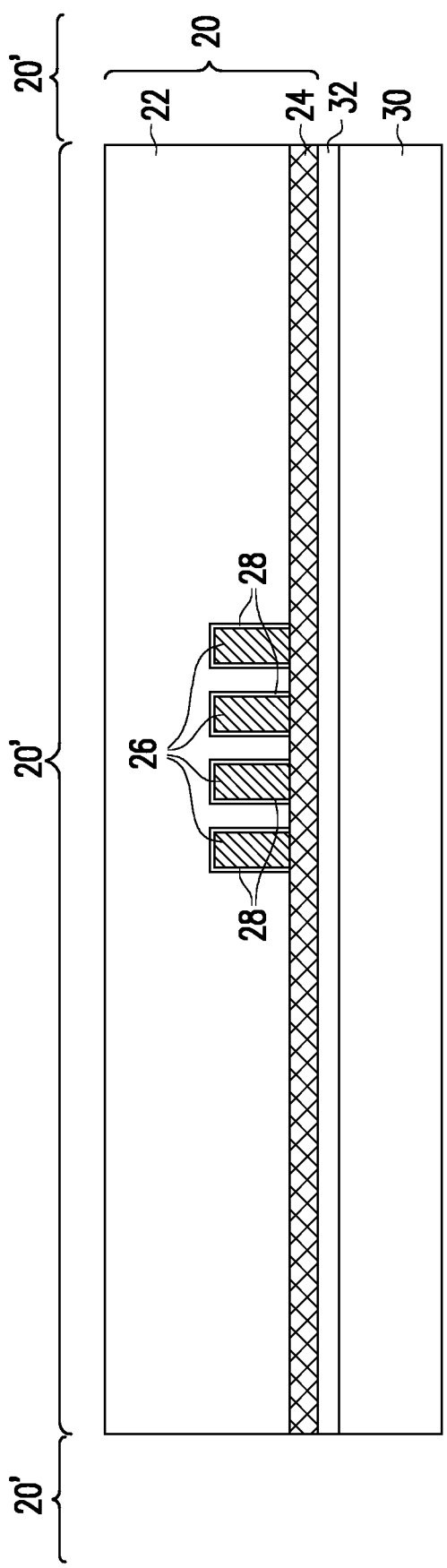
FIGS. 1 through 8 illustrate the cross-sectional views of intermediate stages in the formation of a memory die stack attached to a front side of a logic die in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A die stack including memory dies and the method of forming the same are provided in accordance with various embodiments. The intermediate stages in the formation of the die stack are illustrated in accordance with some embodiments. Some variations of some embodiments are discussed. Throughout the various views and illustrative embodiments, like reference numbers are used to designate like elements. In accordance with some embodiments of the present disclosure, a die stack includes a memory die stack bonded to a device die such as a logic die. Instead of forming Through-Silicon-Vias (TSVs) in the memory die, through-dielectric vias are formed in the encapsulant (such as molding compound) for encapsulating the memory dies, and the TSVs are used for connecting the memory dies to the logic die. If the TSVs are formed in the semiconductor substrates of memory dies, the semiconductor substrates will adversely cause the loading to the TSVs due to the parasitic capacitance between the TSVs and the semiconductor substrates. In accordance with some embodiments of the present disclosure, through-dielectric vias are formed in the dielectric encapsulant, and hence there is no loading. Since the loading may cause signal attenuation, by forming the through-dielectric vias, the signal attenuation is avoided.

It is appreciated that embodiments will be described with respect to a specific context, namely a die stack including memory dies bonded to a device die. The concept of the discussed embodiments may also be applied to the structure and the processing of other structures including, and not limited to, the formation of logic die stacks, IO die stack, or the die stack with the mixed logic die(s), IO die(s), memory die(s), and the like. Embodiments discussed herein are to provide examples to enable making or using the subject matter of this disclosure, and a person having ordinary skill in the art will readily understand modifications that can be made while remaining within contemplated scopes of different embodiments. Like reference numbers and characters in the figures below refer to like components. Although method embodiments may be discussed as being performed in a particular order, other method embodiments may be performed in any logical order.

FIGS. 1 through 8 illustrate the cross-sectional views of intermediate stages in the formation of a die stack in accordance with some embodiments of the present disclosure. The corresponding processes are also reflected schematically in the process flow 300 shown in FIG. 33.

Referring to FIG. 1, carrier 30 is provided, and release film 32 is formed on carrier 30. Carrier 30 is formed of a transparent material, and may be a glass carrier, a ceramic carrier, an organic carrier, or the like. Carrier 30 may have a round top-view shape, and may have a size of a silicon wafer. Release film 32 is formed over carrier 30, and may be formed of a Light-To-Heat-Conversion (LTHC) coating material. Release film 32 may be applied onto carrier 30 through coating. In accordance with some embodiments of the present disclosure, release film 32 is capable of being decomposed under the heat of light/radiation (such as a laser beam), and hence can release carrier 30 from the structure formed thereon.

Device wafer 20 is placed over release film 32. The respective process is illustrated as process 302 in the process flow shown in FIG. 33. In accordance with some embodiments, device wafer 20 may be a logic wafer including a plurality of logic dies 20'. Accordingly, device wafer 20 is also referred to as a logic wafer, and device dies 20' are also referred to as logic dies hereinafter. In accordance with alternative embodiments, device wafer 20 is another type of wafer such as an input-output wafer, an interposer wafer, or the like. In accordance with some example embodiments of the present disclosure, device dies 20' are Central Processing Unit (CPU) dies, Graphic Processing Unit (GPU) dies, mobile application dies, Micro Control Unit (MCU) dies, BaseBand (BB) dies, Application processor (AP) dies, or the like. Device dies 20' include semiconductor substrate 22 and interconnect structure 24 formed on the semiconductor substrate 22.

Figure 26:
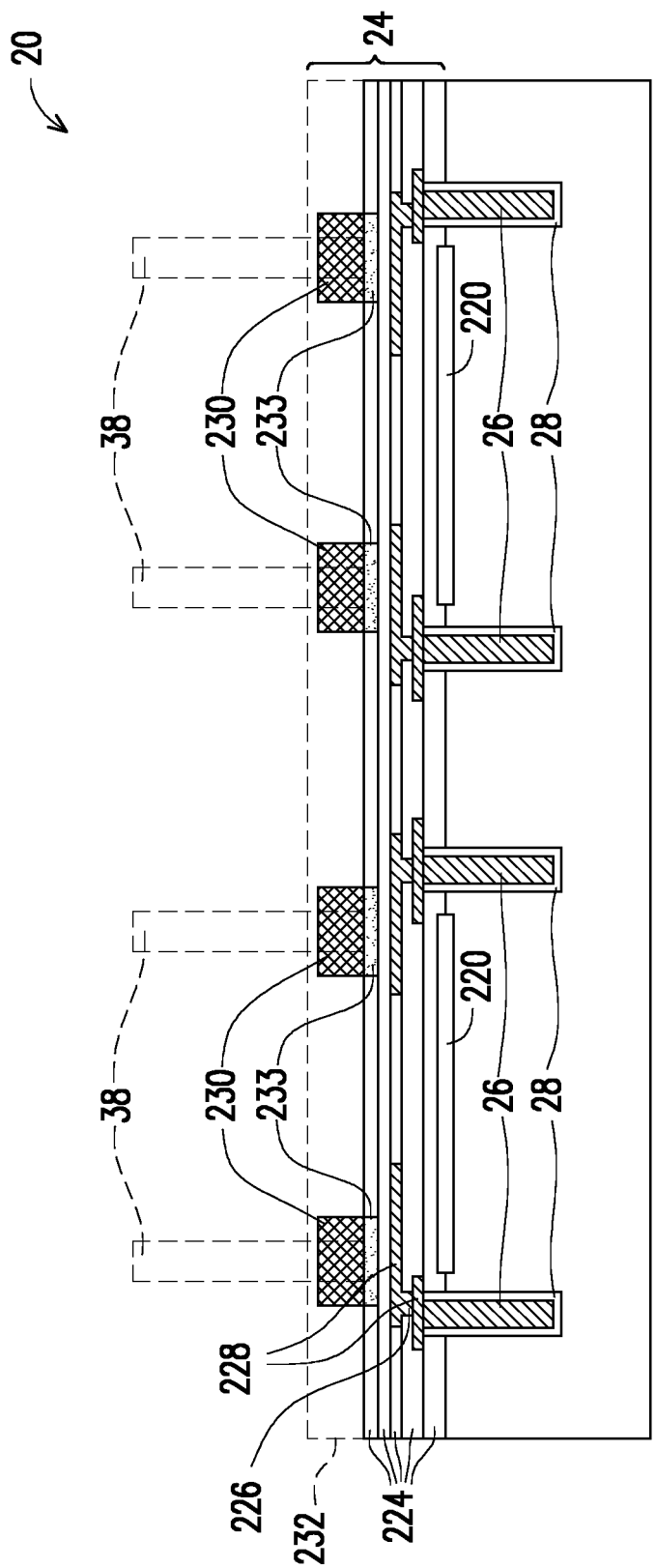
FIGS. 26 and 27 illustrate the cross-sectional views of an example logic die before and after forming connections to Through-Silicon Vias (TSVs) in accordance with some embodiments.

Interconnect structure 24 is illustrated schematically in FIG. 1, and some details are shown in FIG. 26 in accordance with some examples. Referring to FIG. 26, device wafer 20 includes substrate 22. In accordance with some embodiments, substrate 22 is a semiconductor substrate, which may include or be a crystalline silicon substrate, although it may comprise other semiconductor materials such as silicon germanium, silicon carbon, or the like. In accordance with some embodiments, device dies 20' include active circuits 220, which include active devices such as transistors (not shown) formed at the top surface of semiconductor substrate 22. In accordance with some embodiments in which wafer 20 is an interposer wafer, there is no circuit at the top surface of wafer 20. Through-vias (sometimes referred to as Through-Substrate Vias (TSVs)) 26 may be formed to extend into substrate 22. TSVs 26 are also sometimes referred as through-silicon vias when formed in a silicon substrate. Each of TSVs 26 may be encircled by an isolation liner 28, which is formed of a dielectric material such as silicon oxide, silicon nitride, or the like. Isolation liners 28 isolate the respective TSVs 26 from semiconductor substrate 22. TSVs 26 and isolation liners 28 extend from a top surface of semiconductor substrate 22 to an intermediate level between the top surface and the bottom surface of semiconductor substrate 22.

Interconnect structure 24 is formed over semiconductor substrate 22. Interconnect structure 24 may include a plurality of dielectrics layers 224. Metal lines 228 and vias 226 are formed in dielectric layers 224, and are electrically connected to TSVs 26 and circuits 220. In accordance with some embodiments, dielectric layers 224 are formed of silicon oxide, silicon nitride, silicon carbide, silicon oxynitride, combinations thereof, and/or multi-layers thereof. Dielectric layers 224 may comprise one or more Inter-Metal-Dielectric (IMD) layers formed of low-k dielectric materials having low k values, which may be, for example, lower than about 3.0, or in the range between about 2.5 and about 3.0.

Electrical connectors 230 are formed at the top surface of device dies 20'. In accordance with some embodiments, electrical connectors 230 comprise metal pillars, metal pads, metal bumps (sometimes referred to as micro-bumps), or the like. The material of electrical connectors 230 may include non-solder materials, which may include and may be copper, nickel, aluminum, gold, multi-layers thereof, alloys thereof, or the like. Electrical connectors 230 may be electrically connected to integrated circuits 220 through some other conductive features (not shown) including, and not limited, aluminum pads, Post Passivation Interconnect (PPI), or the like, and through metal lines 228 and vias 226. Also, between electrical connectors 230 and metal lines 228, there may be dielectric layers such as low-k dielectric layers, passivation (non-low-k) layers, polymer layers, or the like. Electrical connectors 230 may be encapsulated in dielectric layer 232. In accordance with some embodiments of the present disclosure, dielectric layer 232 is a polymer layer formed of, for example, polybenzoxazole (PBO), polyimide, benzocyclobutene (BCB), or the like.

In accordance with some embodiments, as also shown in FIG. 26, instead of having electrical connectors 230 as being the top conductive feature of device die 20', metal posts 38 may be formed to protrude above the rest of device dies 20' (wafer 20). Metal posts 38 are shown as dashed so show that they may be formed at this stage, or formed in the step shown in FIG. 3. In accordance with some embodiments, dielectric layer 232 is not formed, and metal posts 38 are formed directly on metal pads 33. When these embodiments are adopted, the process for forming metal posts 38 as shown in FIG. 3 is skipped.

Throughout the description, the side of semiconductor substrate 22 having active circuits 220 and interconnect structure 24 is referred to as a front side (or active side) of semiconductor substrate 22, and the opposite side is referred to as a backside (or inactive side) of semiconductor substrate 22. Also, the front side of semiconductor substrate 22 is also referred to as the front side (or active side) of device die 20' (and wafer 20), and the backside of semiconductor substrate 22 is also referred to as the backside (or inactive side) of device die 20' (wafer 20).

Figure 2:
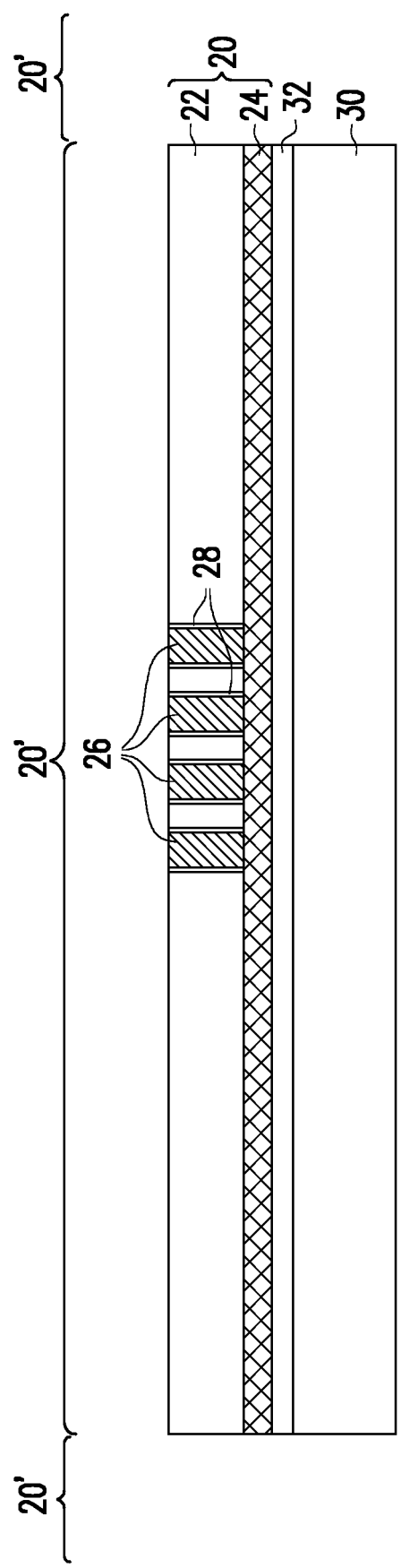

Referring back to FIG. 1, wafer 20 is placed with the front side facing carrier 30. The details of interconnect structure 24 is not shown, and may be found referring to FIG. 26. Next, as shown in FIG. 2, substrate 22 is thinned, for example, in a Chemical Mechanical Polish (CMP) process or a mechanical polish process. As a result, TSVs 26 are exposed. The respective process is illustrated as process 304 in the process flow shown in FIG. 33.

Figure 3:
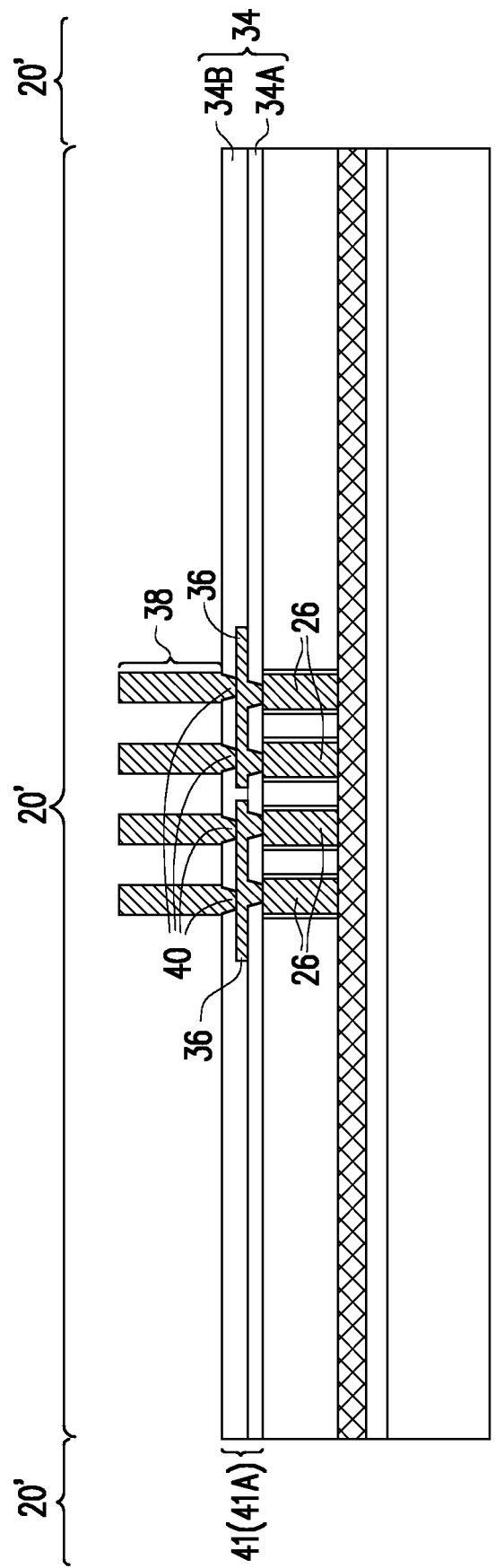

FIG. 3 illustrates the formation of redistribution structure 41 (41A), which includes dielectric layers 34 (including 34A and 34B) and Redistribution Lines (RDLs) 36. The respective process is illustrated as process 306 in the process flow shown in FIG. 33. In accordance with some embodiments, dielectric layers 34 are formed of polymers such as PBO, polyimide, or the like. The formation method includes coating a dielectric layer 34 in a flowable form, and then curing the corresponding dielectric layer. In accordance with alternative embodiments of the present disclosure, dielectric layers 34 are formed of inorganic dielectric materials such as silicon nitride, silicon oxide, silicon carbide, multi-layers thereof, combinations thereof, or the like. The formation method may include coating, Chemical Vapor Deposition (CVD), Atomic Layer Deposition (ALD), Plasma-Enhanced Chemical Vapor Deposition (PECVD), or other applicable deposition methods. Dielectric layers layer 34 may include dielectric layers 34A and 34B, and more dielectric layers may be formed, depending on the routing requirement.

RDLs 36 are formed to have via portions extend into dielectric layer 34A, and trace portions over dielectric layer 34A. The formation process may include patterning dielectric layer 34A to form openings, with TSVs 26 exposed through the openings, forming a blanket metal seed layer (not shown), forming and patterning a plating mask (such as a photo resist) to reveal some portions of the metal seed layer, plating RDLs 36 in the openings in the plating mask, removing the plating mask, and etching the portions of the metal seed layer previously covered by the plating mask. In accordance with some embodiments of the present disclosure, the metal seed layer includes a titanium layer and a copper layer over the titanium layer. The formation of the metal seed layer may include, for example, PVD. In accordance with some embodiments of the present disclosure, the plated material comprises copper or a copper alloy. The plating may include electro-chemical plating or electro-less plating. Throughout the description, dielectric layers 34 and the RDLs 36 formed therein are in combination referred to as redistribution structure 41.

Although one layer of RDLs 36 is illustrated, more layers of RDLs may be formed. Metal posts 38 are then formed. The respective process is illustrated as process 308 in the process flow shown in FIG. 33. In accordance with some embodiments, the formation process includes patterning dielectric layer 34B to form openings, with some pad portions of RDLs 36 exposed through the openings, forming a blanket metal seed layer (not shown), forming and patterning another plating mask (such as a photo resist) to reveal some portions of the metal seed layer, plating metal posts 38 in the openings in the plating mask, removing the plating mask, and etching the portions of the metal seed layer previously covered by the plating mask to form metal posts 38. Vias 40 are also formed in the same process as forming metal posts 38, and extend into dielectric layer 34B.

Figure 4:
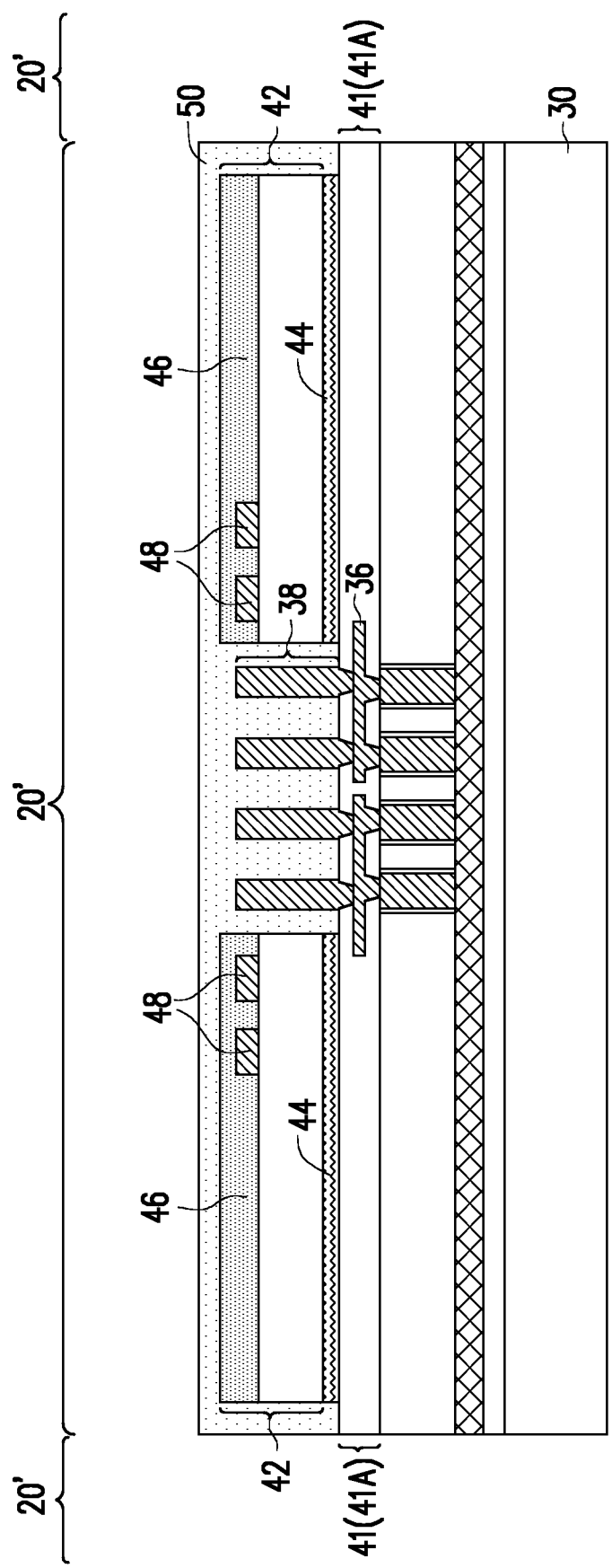

FIG. 4 illustrates the placement of tier-1 memory dies 42. The respective process is illustrated as process 310 in the process flow shown in FIG. 33. Memory dies 42 may be attached to dielectric layers 34 through Die-Attach Films (DAFs) 44, which are adhesive films. DAFs 44 may be pre-attached on the respective wafers that have memory dies 42 therein before the wafers are sawed into memory dies 42. Memory dies 42 may include semiconductor substrates (240, FIG. 28) having a back surface (the surface facing down) in physical contact with the respective DAFs 44. Since carrier 30 is at wafer level, although two memory dies 42 are illustrated as a group, a plurality of identical memory groups are placed over redistribution structure 41, with each of the groups overlapping one of device dies 20'. Also, there may be more memory dies such as 4, 6, 8 or more in a group.

Figure 28:
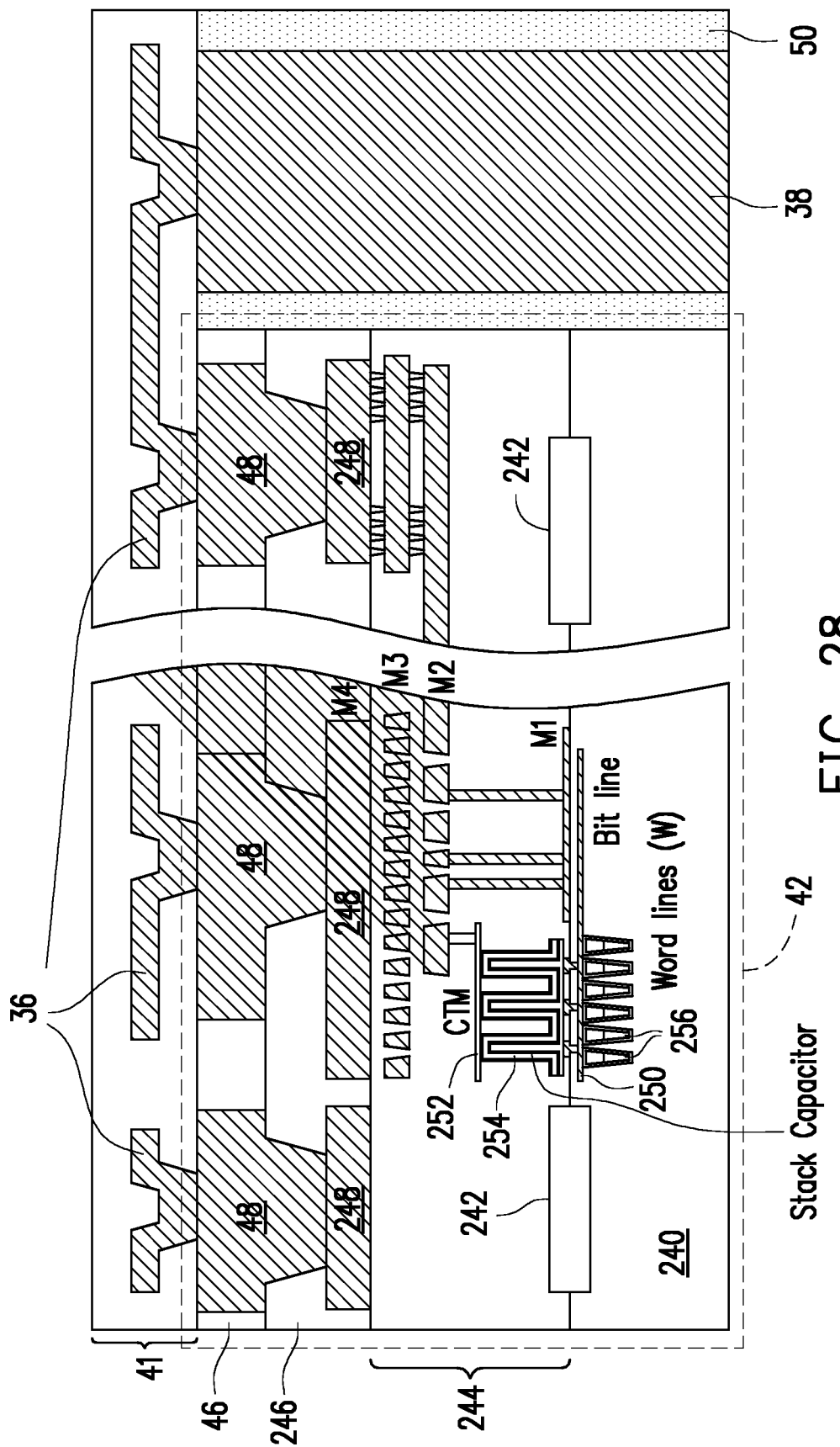
FIG. 28 illustrates the cross-sectional view of an example memory die in accordance with some embodiments.

The details of memory dies 42 are not shown in FIG. 4, and some of the details are illustrated in FIG. 28 in accordance with some embodiments of the present disclosure. FIG. 28, in addition to memory die 42, also illustrate some other portions, which will be discussed in subsequent paragraphs. Memory die 42 may include semiconductor substrate 240, integrated circuits 242, which may include active devices such as transistors, diode, or the like. There is no through-via penetrating through semiconductor substrate 240. Memory dies 42 may include memories such as Dynamic Random Access Memories (DRAMs), Static Random Access Memories (SRAMs), or other types of memories. For example, FIG. 28 illustrates some stack capacitors, which may be used in DRAMs. Top metal contact (CTM) 252 and bottom contact metal 250 are also illustrated. In accordance with some embodiments, the bottom contact metal 250 is used as the bit-line, and word-lines 256 may be embedded in semiconductor substrate 240. Interconnect structure 244 is formed over substrate 240, and may include dielectric layers, metal lines, vias, and the like. The dielectric layers may include low-k dielectric layers and/or non-low-k dielectric layers. In accordance with some embodiments, interconnect structure 244 includes a plurality of metal layers, such as M1, M2, M3, and M4 (or more) as shown in FIG. 28. Passivation layer 246, which is formed of a non-low-k dielectric material such as Undoped silicate glass, silicon oxide, silicon nitride, or multi-layers thereof, is formed over interconnect structure 244. Metal pads 248, which may be parts of metal layer M4, are formed over and electrically coupled to the metal lines and vias in interconnect structure 244. Metal pads 248 may be formed of aluminum copper, for example. Electrical connectors 48, which may be formed of copper, nickel, titanium, or the like, may be formed over and connected to metal pads 248. Dielectric layer 46, which may be formed of PBO, polyimide, or the like, may be formed to encapsulate electrical connectors 48.

Referring back to FIG. 4, memory dies 42 and metal posts 38 are encapsulated in encapsulant 50. The respective process is illustrated as process 312 in the process flow shown in FIG. 33. Encapsulant 50 fills the gaps between neighboring metal posts 38 and the gaps between metal posts 38 and memory dies 42. Encapsulant 50 may include a molding compound, a molding underfill, an epoxy, and/or a resin. The top surface of encapsulant 50 is higher than the top ends of electrical connectors 48 and metal posts 38. When formed of molding compound, encapsulant 50 may include a base material, which may be a polymer, a resin, an epoxy, or the like, and filler particles in the base material. The filler particles may be dielectric particles of $SiO_2$, $Al_2O_3$, silica, or the like, and may have spherical shapes. Also, the spherical filler particles may have a plurality of different diameters.

In a subsequent step, a planarization process such as a CMP process or a mechanical grinding process is performed to thin encapsulant 50 and memory dies 42, until metal posts 38 and electrical connectors 48 are exposed. Due to the planarization process, the top ends of metal posts 38 are substantially level (coplanar) with the top surfaces of electrical connectors 48, and are substantially coplanar with the top surface of encapsulant 50. Metal posts 38 are alternatively referred to as through-vias 38 in subsequent paragraphs since they penetrate through encapsulant 50.

Figure 5:
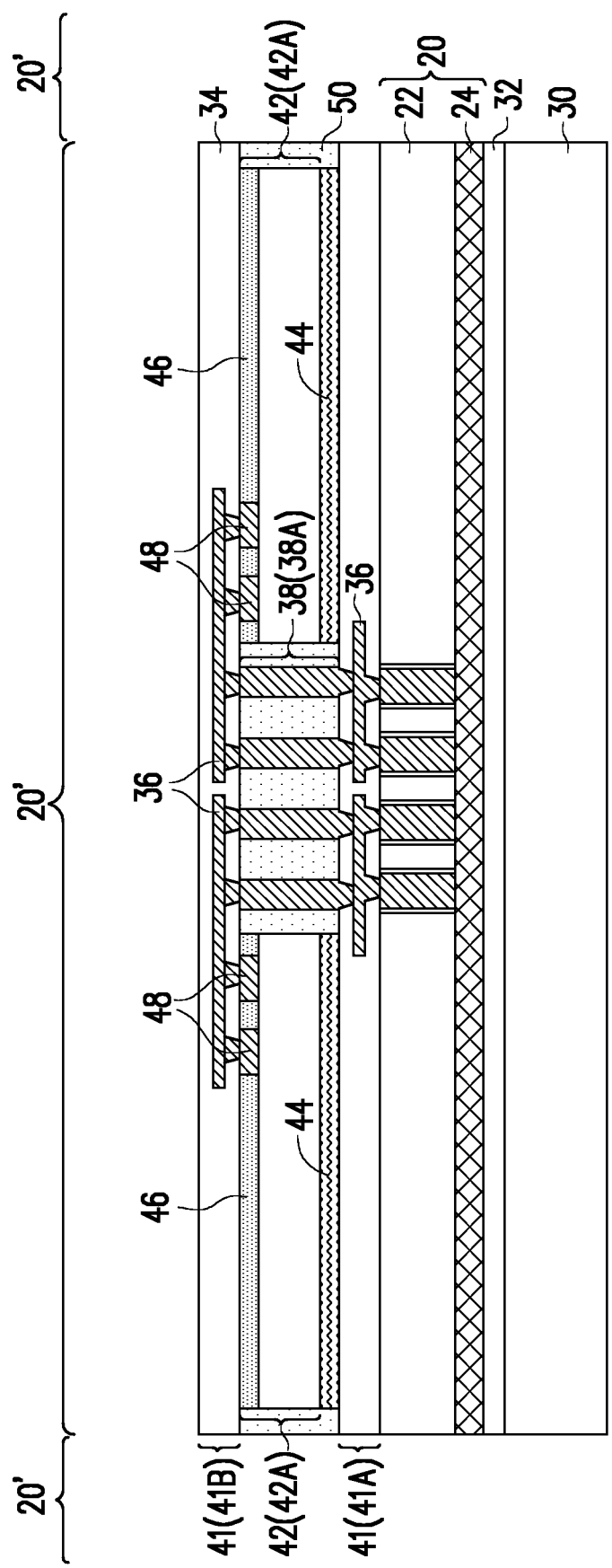

FIG. 5 illustrates the formation of another redistribution structure 41 (41B), which includes RDLs 36 and dielectric layers 34. The respective process is illustrated as process 314 in the process flow shown in FIG. 33. To distinguish between different tiers of redistribution structure 41, the redistribution structure 41 underlying memory dies 42 is referred to as (tier-1) redistribution structure 41A, and the redistribution structure 41 overlying memory dies 42 is referred to as (tier-2) redistribution structure 41B. Also, the illustrated tier-1 memory dies 42 are identified as memory dies 42A, and the illustrated through-vias 38 may be identified as (tier-1) through-vias 38A.

The RDLs 36 in tier-2 redistribution structure 41B are electrically connected to through-vias 38A and electrical connectors 48 in memory dies 42. Accordingly, through-vias 38A electrically connect memory dies 42 to device die 20'. It is appreciated that the RDLs 36 are shown schematically, while RDLs 36 do not electrically short through-vias 38 and electrical connectors 48 together. Instead, different through-vias 38 may be connected to different electrical connectors 48 through different RDLs 36. Similarly, RDLs 36 do not electrically short electrical connectors 48 together.

Figure 6:
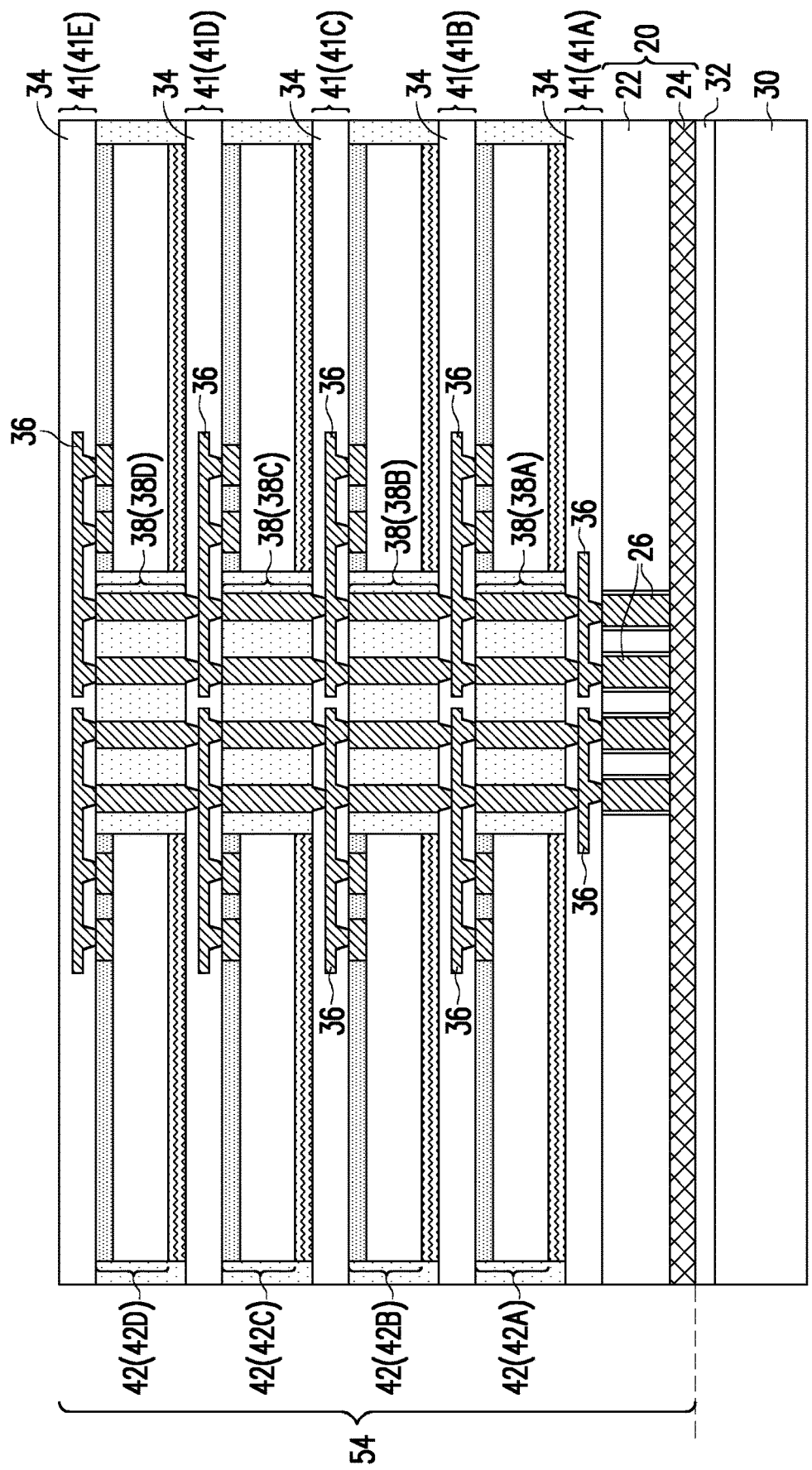

FIG. 6 illustrates the formation/adhesion of more tiers of memory dies 42 (including 42B, 42C, and 42D), through-vias 38 (including 38B, 38C, and 38D), and redistribution structures 41 (including 41C, 41D, and 41E), etc. The respective process is illustrated as process 316 in the process flow shown in FIG. 33. The formation processes and the corresponding materials may be found referring to the discussion of FIGS. 3 through 5, and hence are not repeated herein. Memory dies 42C and 42D may be identical to, or different from, memory dies 42A and 42B. In the final result, all of the memory dies 42 are electrically and signally connected to the respective underlying device die 20'. Throughout the description, the features over release film 32 in combination are collectively referred to as reconstructed wafer 54.

Figure 7:
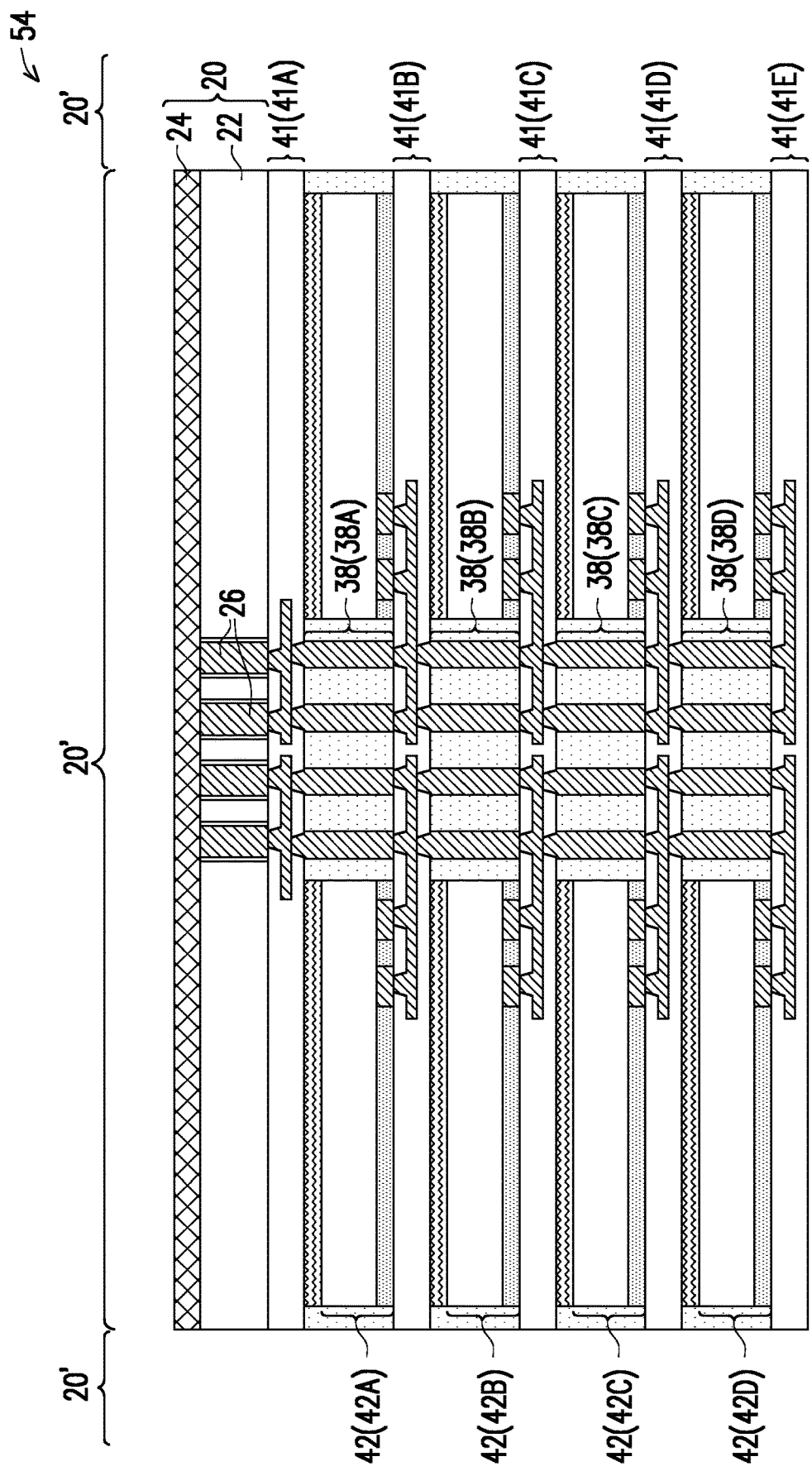
Figure 8:
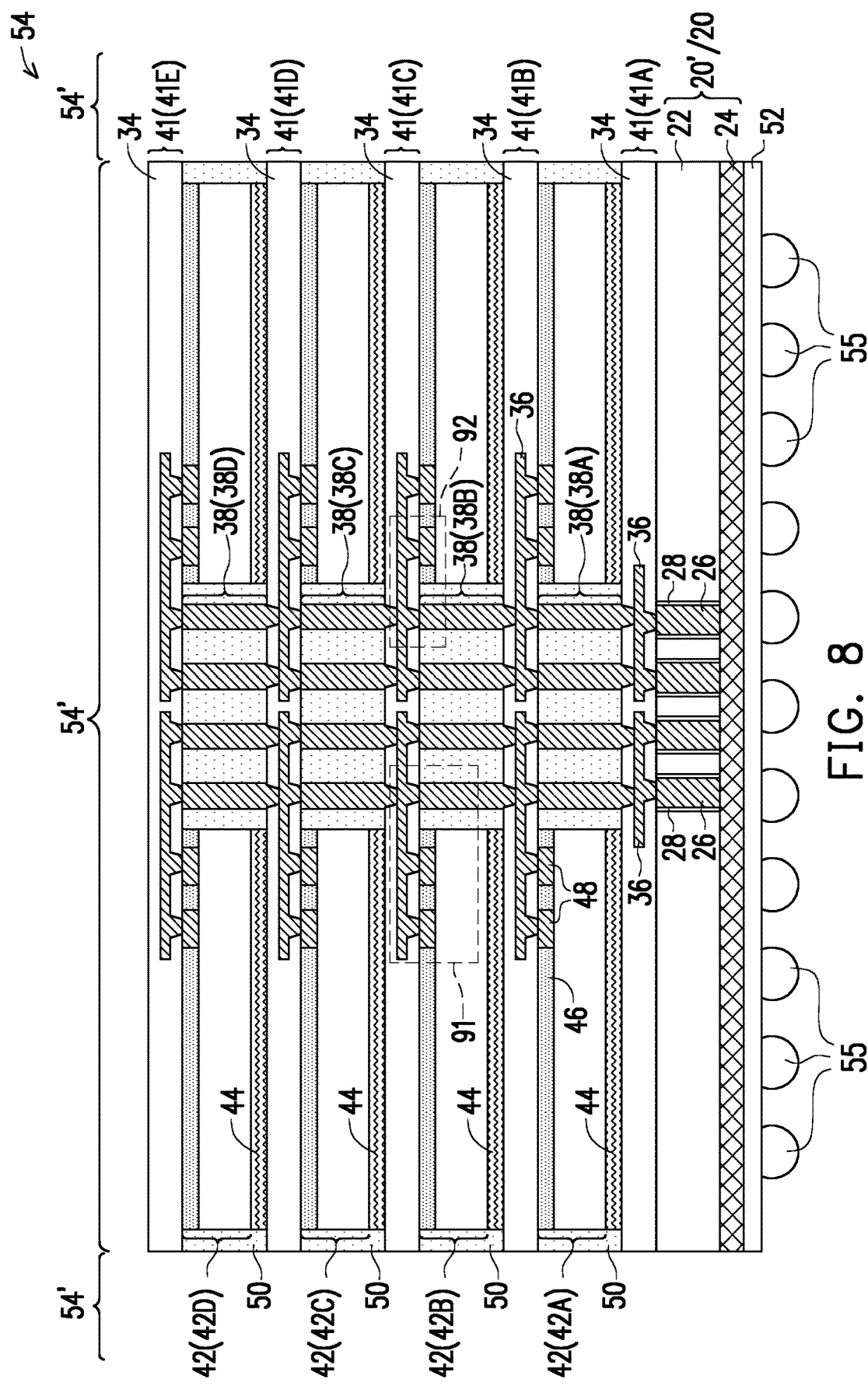

Reconstructed wafer 54 is then demounted from carrier 30, for example, by projecting a laser beam on release film 32. Release film 32 is decomposed under the heat of the laser beam. The resulting reconstructed wafer 54 is shown in FIG. 7. Next, as shown in FIG. 8, redistribution structure 52 is formed on the interconnect structure 24 of device die 20' in accordance with some embodiment. The respective process is illustrated as process 318 in the process flow shown in FIG. 33. In accordance with alternative embodiments, the formation of redistribution structure 52 is skipped. Accordingly, the process 318 in FIG. 33 is illustrated using dashed lines to indicate it may or may not be performed. Before the formation of redistribution structure 52, the dielectric layer 232 (FIG. 26) that covers electrical connectors 230 are thinned, until electrical connectors 230 are exposed. The detail of redistribution structure 52 is not shown. Redistribution structure 52 may be formed, for example, using the similar process and materials for forming redistribution structure 41. Redistribution structure 52 includes dielectric layers and redistribution lines in the dielectric layers. Electrical connectors 55 are then formed on redistribution structure 52, and are electrically connected to device die 20' through redistribution structure 52. The respective process is illustrated as process 320 in the process flow shown in FIG. 33. Electrical connectors 55 may include metal pillars, solder regions, Under-Bump Metallurgies (UBMs), and the like.

Figure 27:
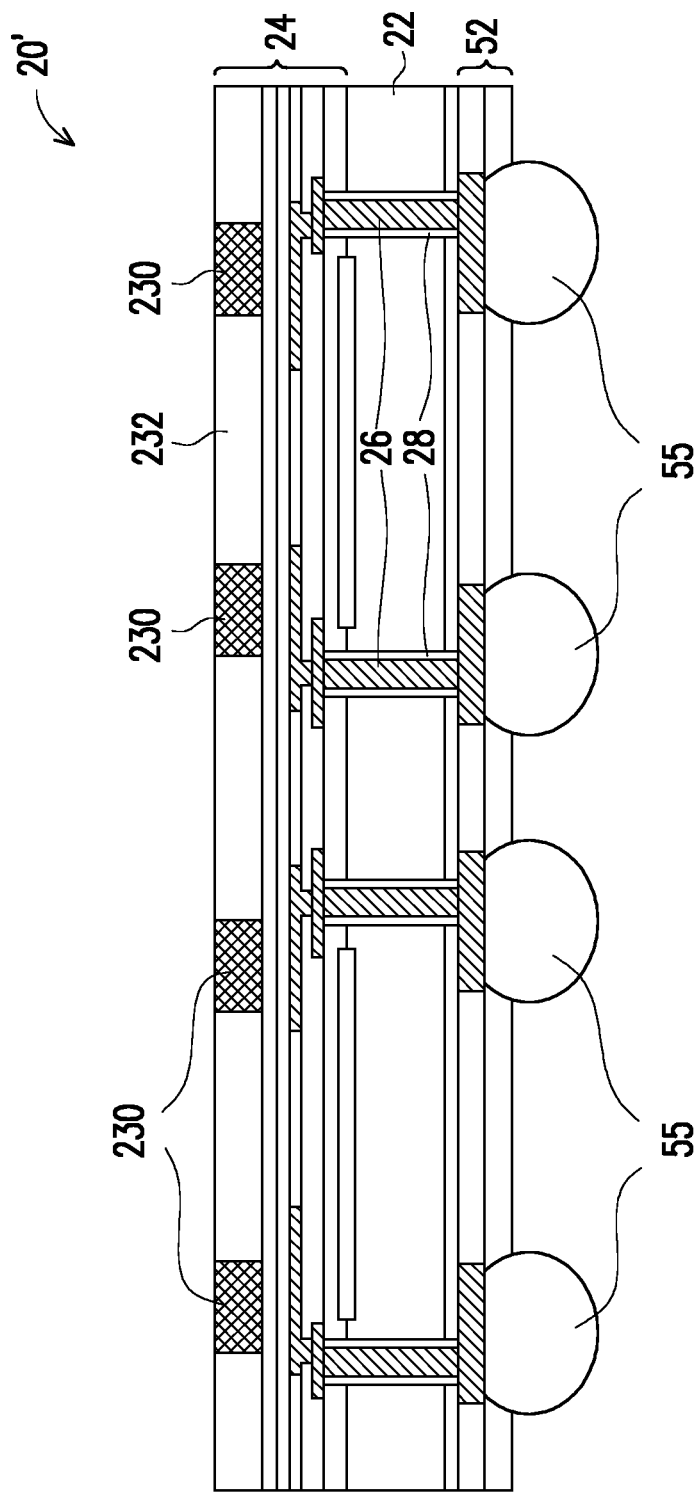

FIG. 27 illustrates device die 20' after the formation of redistribution structure 52 and electrical connectors 55 in accordance with some embodiments. The redistribution structures and memory die stack over device die 20' is not shown.

Referring back to FIG. 8, reconstructed wafer 54 is singulated in a die-saw process. The respective process is illustrated as process 322 in the process flow shown in FIG. 33. For example, a blade may saw-through the scribe lines between device dies 20' to separate reconstructed wafer 54 into a plurality of identical packages 54', each having the structure as illustrated in accordance with some examples. Package 54' may then be bonded to another package component (not shown) such as an interposer, a package substrate, a printed circuit board, or the like, with underfill disposed in between, for example.

In FIG. 8, through-vias 38 are illustrated as forming common signal channels that are shared by all of the tiers of memory dies 42. In accordance with alternative embodiments, each of the memory dies 42 may have its dedicated signal channel(s), and some of through-vias 38 may be connected to one or some (but not all) tiers of memory dies 42.

FIG. 28 illustrates the amplified view of region 91 in FIG. 8 in accordance with some embodiments. In the amplified view, memory die 42 is encapsulated in encapsulant 50, and the top surfaces of metal pads 48 are coplanar with the top surface of through-via 38. Redistribution structure 41 is formed over memory die 42 and through-vias 38. Although one layer of RDLs 36 is illustrated, there may be a plurality of layers (such as two layers, three layers, or more) of RDLs 36.

Figure 29:
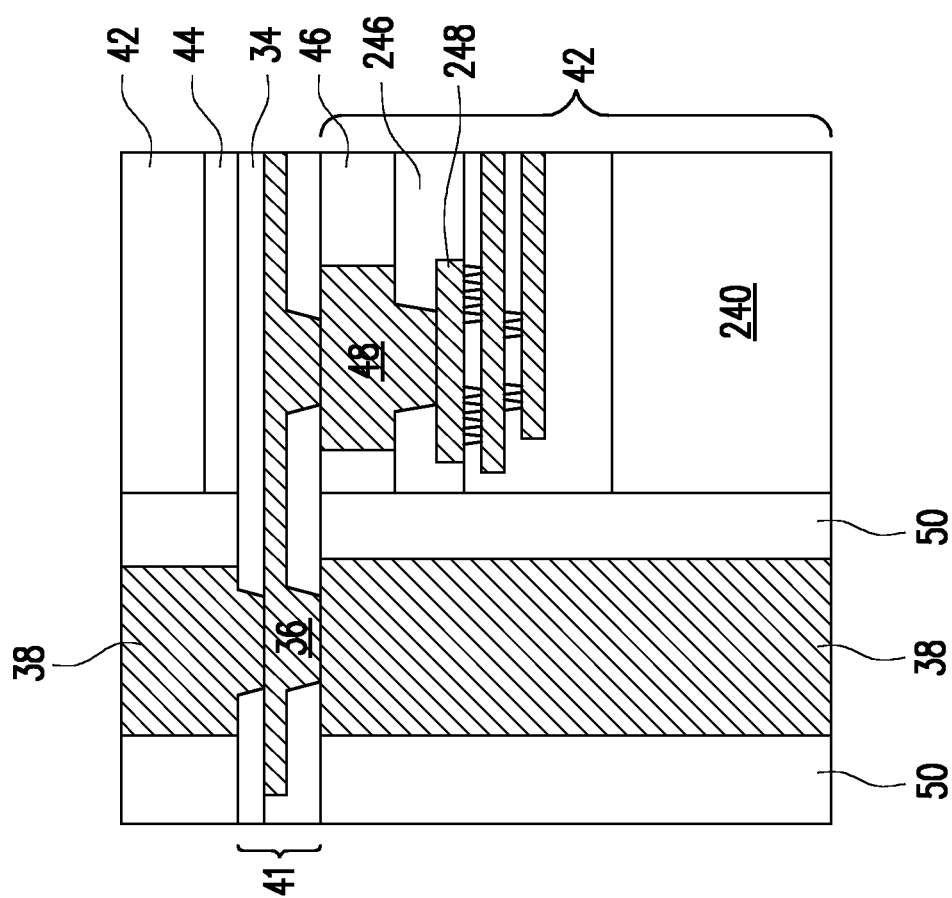
FIGS. 29 through 32 illustrate some details of parts of the structure in FIG. 8 in accordance with some embodiments.

FIGS. 29 through 32 illustrate the amplified views of region 92 in FIG. 8 in accordance with some embodiments of the present disclosure. Referring to FIG. 29, DAF 44 adheres memory die 42 to the top dielectric layer 34 in redistribution structure 41. RDL 36 has a via portion contacting a top surface of metal pad 48, which is located in dielectric layer 46. Dielectric layer 46 may be a polymer layer, which may be formed of polyimide, PBO, or the like. Metal pad 248 may be an aluminum-containing metal pad, which may be an aluminum copper pad in accordance with some embodiments. Alternatively, metal pad 248 may be formed of other materials such as copper or a copper alloy. Passivation layer 246 may be formed of silicon oxide, silicon nitride, multi-layers thereof, or combinations thereof.

Figure 30:
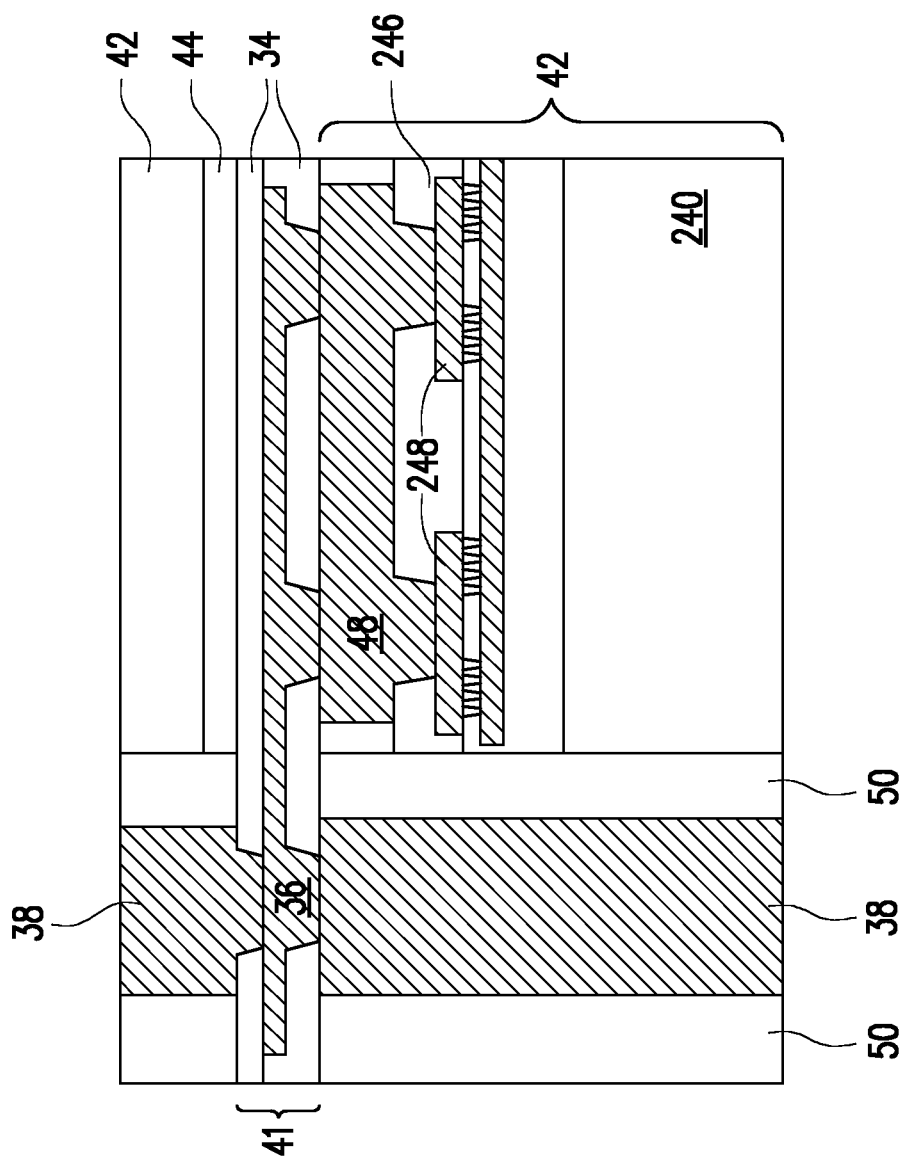

FIG. 30 illustrates the amplified view of region 92 in FIG. 8 in accordance with alternative embodiments. These embodiments are similar to the embodiments shown in FIG. 29, except that the top metal layer, which is the same metal layer comprising metal pads 48 therein, is also used for routing purpose. Alternatively stated, there are metal lines that are at the same level as, and are formed simultaneously as, metal pads 48, wherein the metal lines, as schematically illustrated, may extend horizontally to route the electrical signals. Accordingly, the metal layer in which metal pads 48 are located are considered as one of the metal layers (for routing purpose) in memory die 42. In accordance with some embodiments, metal pads 248, on which metal pads 48 and the corresponding via are landed, are aluminum pads or aluminum copper pads.

Figure 31:
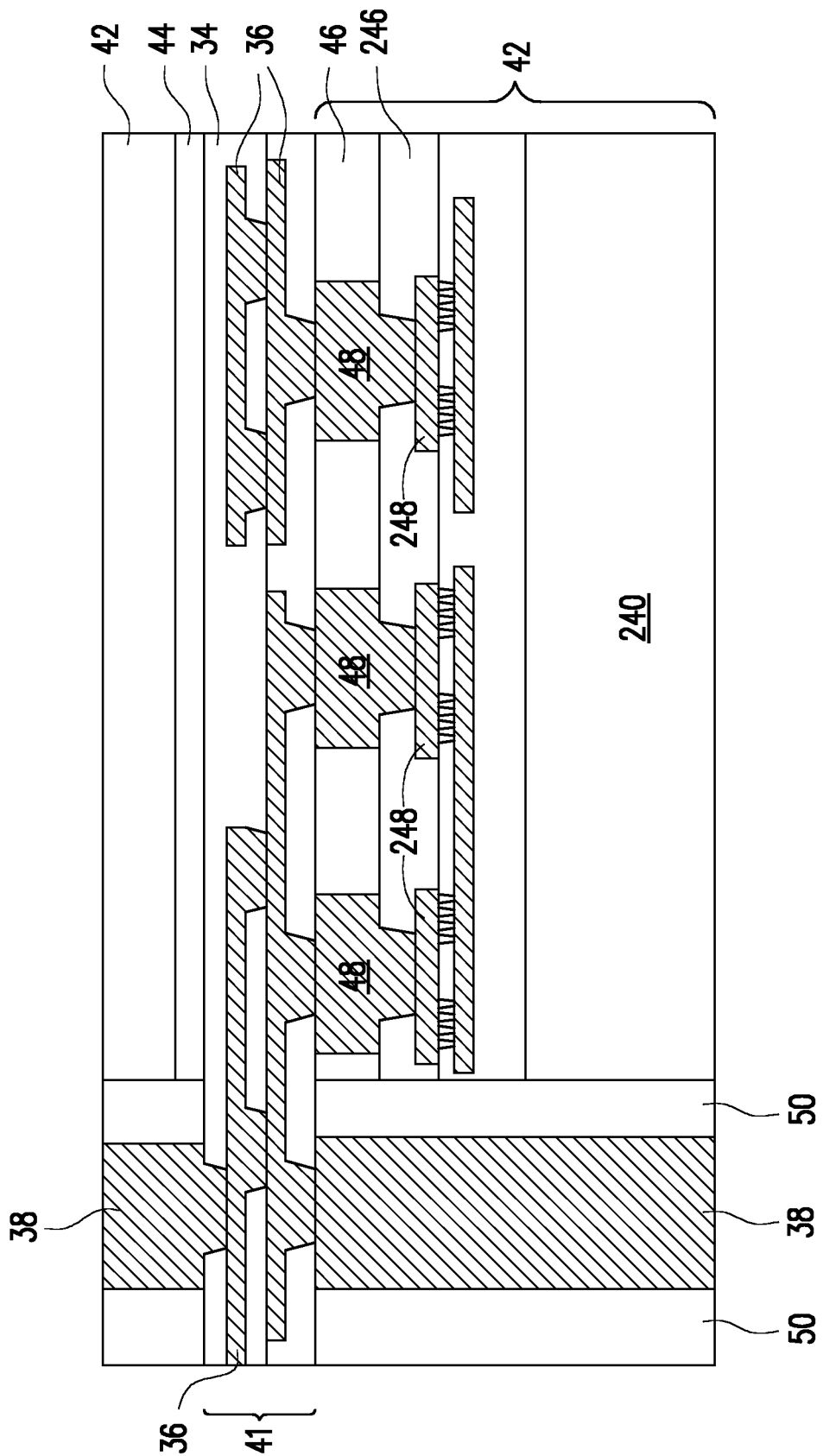

FIG. 31 illustrates the amplified view of region 92 in FIG. 8 in accordance with alternative embodiments. These embodiments are similar to the embodiments shown in FIG. 29, except that two layers of RDLs 36 are illustrated as an example.

Figure 32:
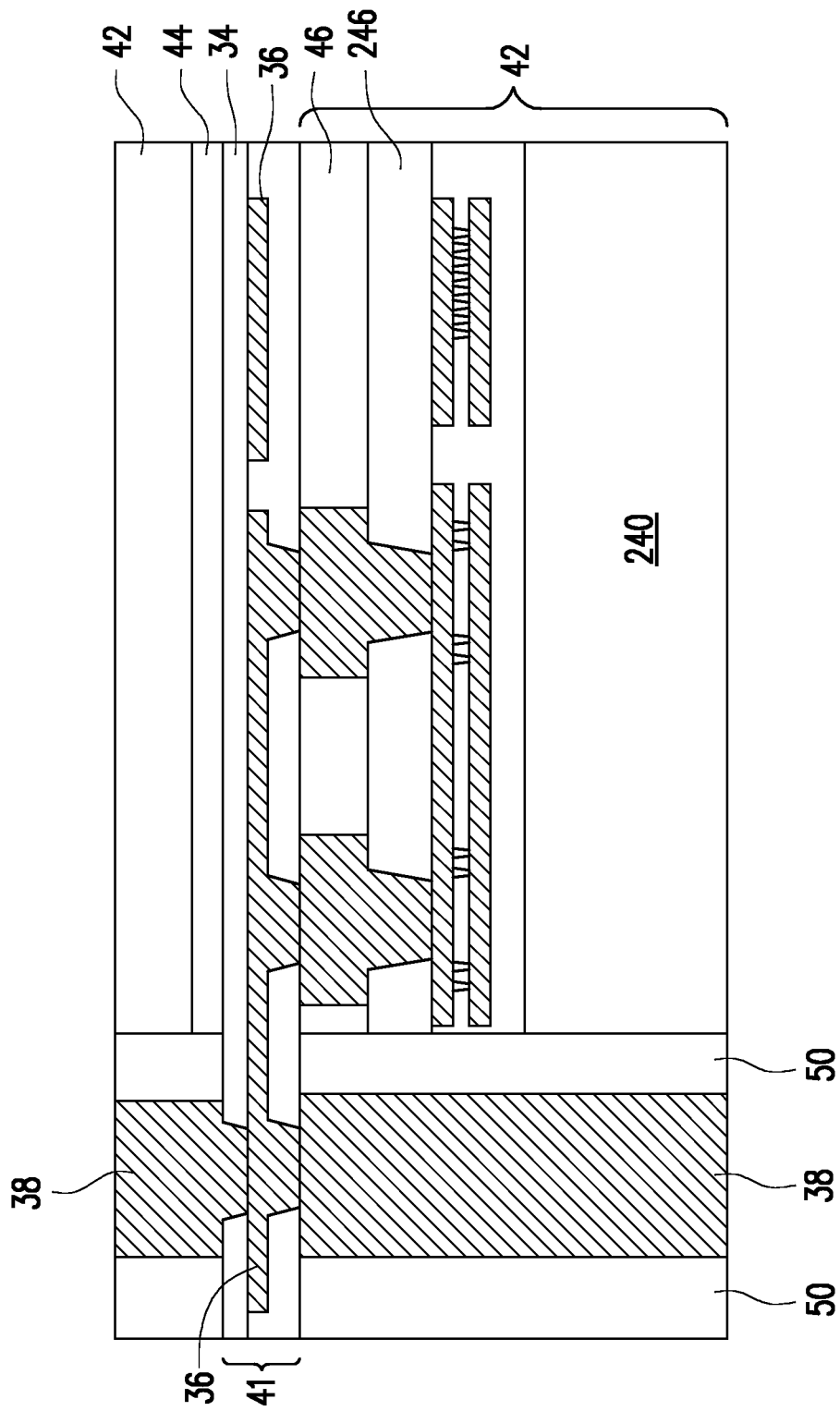

FIG. 32 illustrates the amplified view of region 92 in FIG. 8 in accordance with alternative embodiments. These embodiments are similar to the embodiments shown in FIG. 29, except that there are no aluminum pads formed directly underlying metal pads 48. Rather, the via portions of metal pads 48 are landed on the copper pads in the top metal layer (for example M3).

In the structure shown in FIG. 8, memory dies 42 do not include through-substrate vias in the corresponding semiconductor substrates. The electrical connection of the upper-tier memory dies to device die 20' is made through through-vias 38. Since through-vias 38 are formed in encapsulant 50, which is formed of a dielectric material, there is no parasitic capacitance between through-vias 38 and encapsulant 50 (unlike between TSVs and semiconductor substrates), and the resulting package is also free from the loading that may present in the through-silicon vias.

FIGS. 9, 10, 11A and 11B illustrate packages 54' formed in accordance with alternative embodiments. Unless specified otherwise, the materials and the formation processes of the components in these embodiments (and the embodiments shown in FIGS. 12 through 28) are essentially the same as the like components, which are denoted by like reference numerals in the embodiments shown in FIGS. 1 through 8. The details regarding the formation process and the materials of the components shown in FIGS. 9 through 28 may thus be found in the discussion of the embodiment shown in FIGS. 1 through 8.

Figure 9:
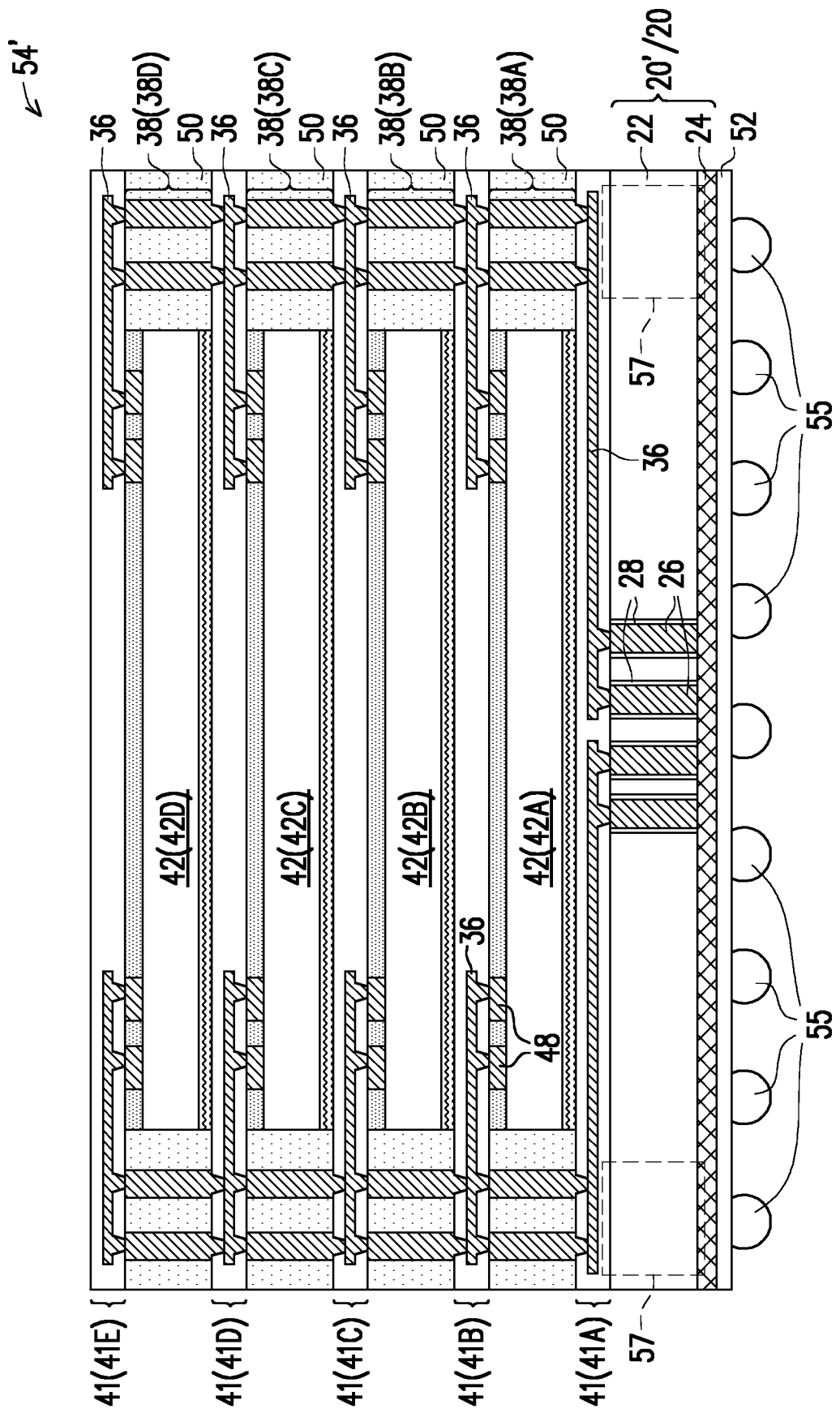
FIGS. 9, 10, 11A and 11B illustrate the cross-sectional views of die stacks in accordance with some embodiments.

In the above-discussed embodiments, through-vias 38 are formed between memory dies 42, and TSVs 26 are formed in the middle of device die 20'. Accordingly, the resulting structure does not need long horizontal RDLs to connect TSVs 26 to through-vias 38. FIG. 9 illustrates an embodiment similar to the embodiments shown in FIG. 8, except that there may be a single memory die 42 in each tier and over each of device dies 20', and that through-vias 38 are accordingly formed on the opposite sides of the memory die 42. In accordance with some embodiments, TSVs 26 are formed in the middle of device die 20' as illustrated. In accordance with alternative embodiments, TSVs 26 may be formed in regions 57, which are close to the edges of device die 20' to reduce the lengths of the lateral distribution lines in redistribution structure 41A.

Figure 10:
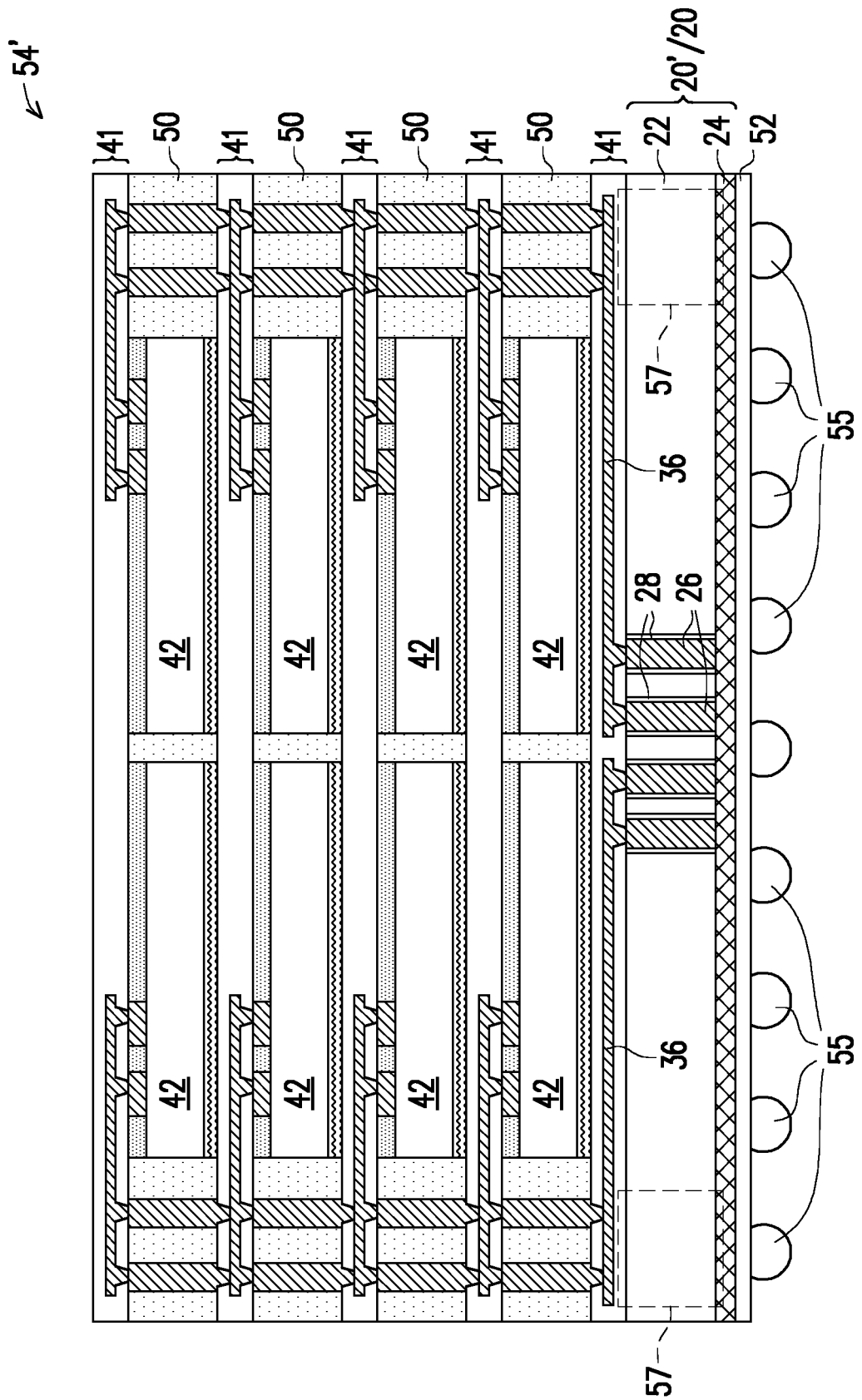

FIG. 10 illustrates an embodiment similar to the embodiments shown in FIG. 8, except that through-vias 38 are formed on the opposite sides of the memory dies 42, rather than between memory dies 42. In accordance with some embodiments, TSVs 26 may be formed close to the edges of device die 20'. Instead of placing a single memory die 42 in each tier, the function of the single memory die may be split into two memory dies, and the memory dies 42 may be placed close to the opposite edges of the device dies 20', so that the lengths of horizontal RDLs 36 may be shortened. These embodiments may be applied when device die 20' has a lateral size much larger than the lateral size of memory die 42. Similarly, TSVs 26 may be formed in the middle of device die 20' as illustrated, or may be formed in regions 57, which are close to the edges of device die 20' to reduce the lengths of the lateral distribution lines 36 in redistribution structure 41A.

Figure 11A:
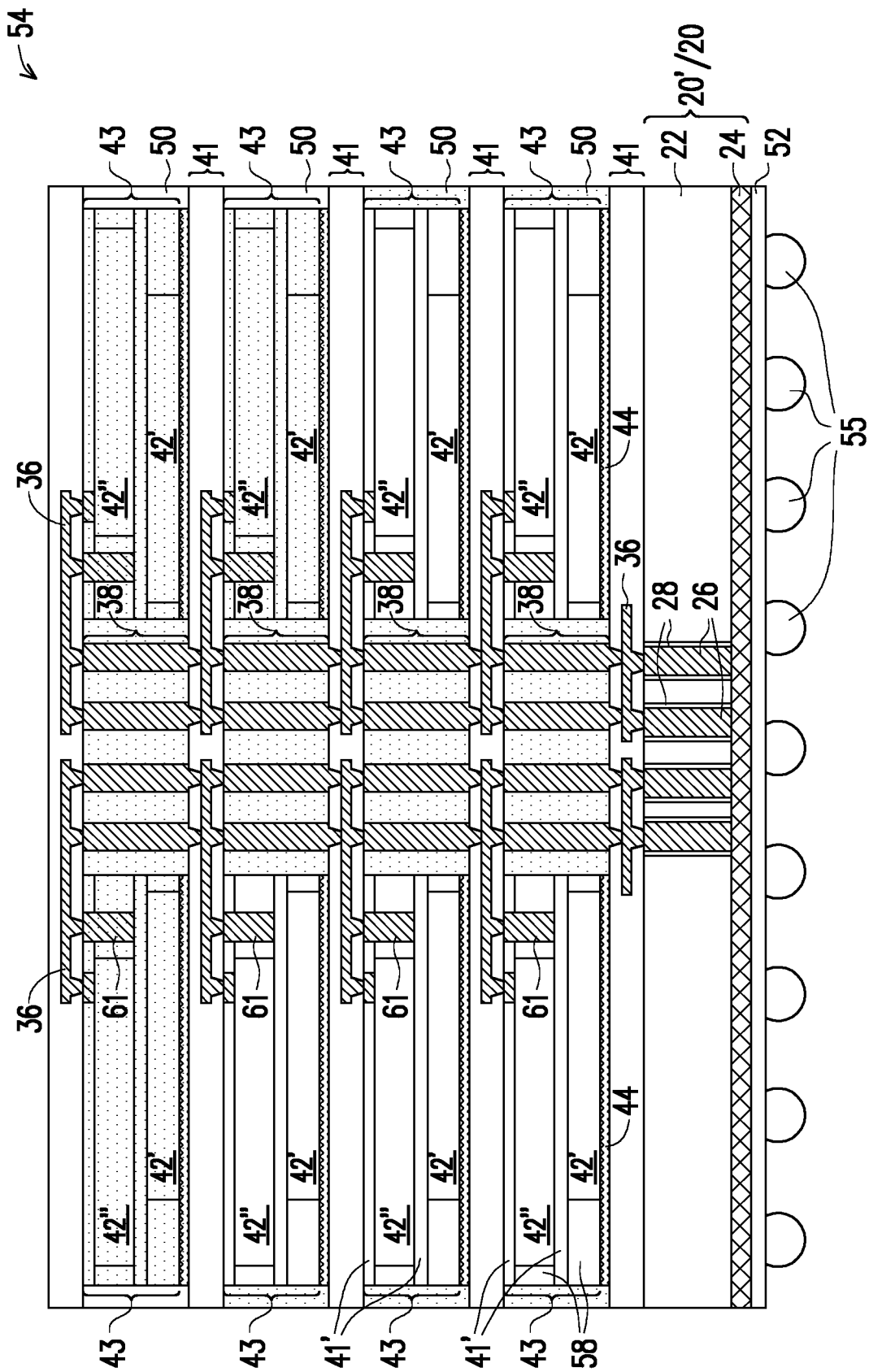

FIG. 11A illustrates an embodiment similar to the embodiments shown in FIG. 8, except that in each tier, memory packages 43, rather than memory dies, are placed. Memory packages 43 may be identical to each other or may be different from each other. Each of memory packages 43 may include memory die 42' and memory die 42", which may be the same as each other, or different from each other. Each of memory dies 42' and 42" may be encapsulated in encapsulant 58, which may be molding compound, for example. Encapsulant 58 may also include a base material such as epoxy, resin, polymer, or the like, and filler particles therein. The filler particles may be spherical, and may have different diameters. Redistribution structures 41', which may be formed similar to redistribution structures 41, are formed over, and electrically connected to the underlying memory dies 42' and 42". Redistribution structures 41' may also include dielectric layers and RDLs therein. Through-vias 61 may be formed in the upper encapsulant 58, and electrically connect memory dies 42' to the RDLs 36 in redistribution structures 41.

Figure 11B:
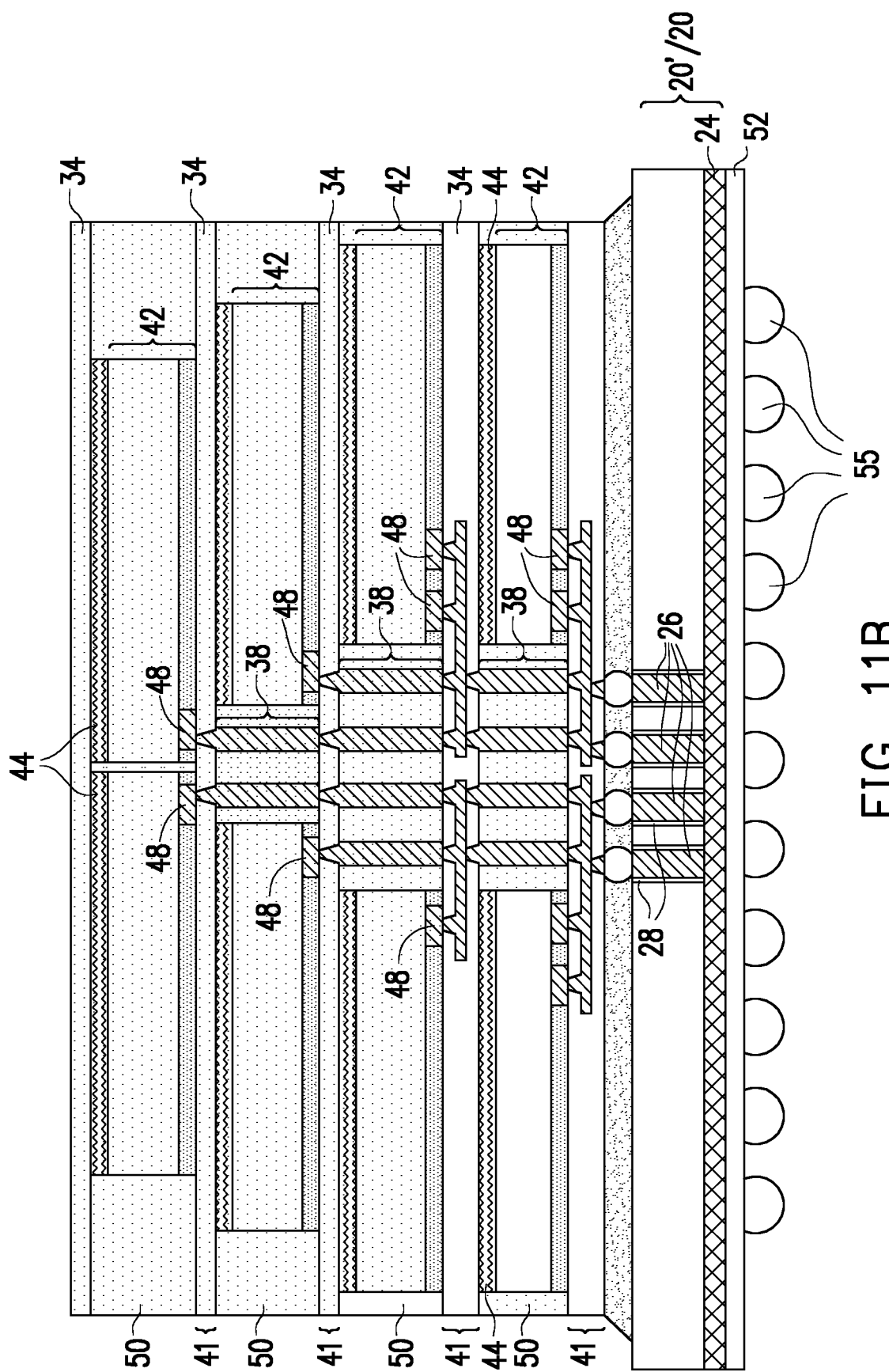

FIG. 11B illustrates an embodiment similar to the embodiments shown in FIG. 8, except that memory dies 42 face down rather than face up. Accordingly, some of the memory dies 42, such as the tier-3 and tier-4 dies, may overlap the corresponding through-vias 38 that connect these memory dies 42 to device die 20'. Furthermore, the each of bond pads 48 may overlap a plurality of through-vias 38 at different levels. Some other bond pads 48 of some memory dies (such as the tier-1 dies and tier-2 dies) may still be connected to horizontal RDLs 36.

Figure 12:
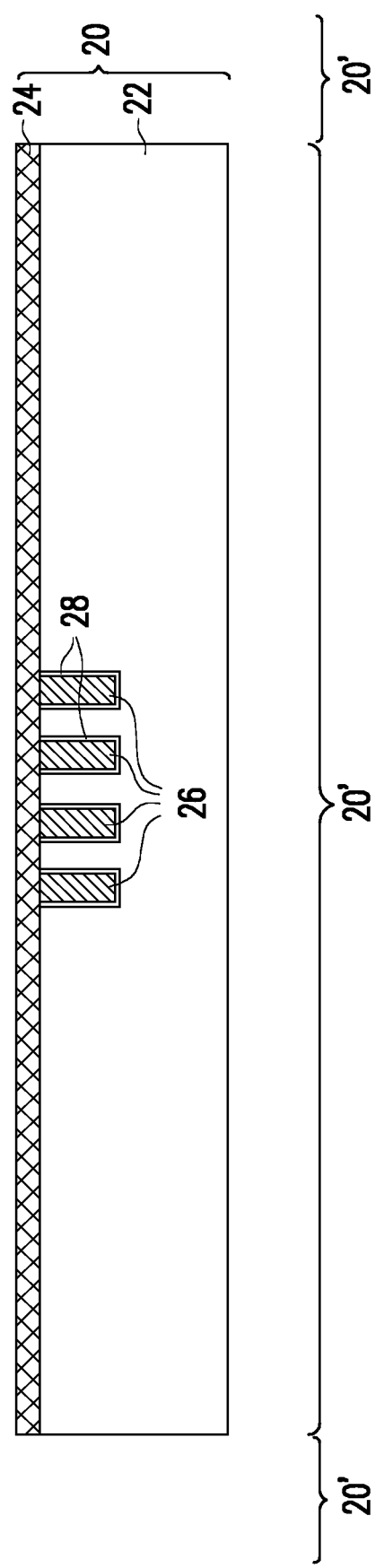
FIG. 12 through 18 illustrate the cross-sectional views of intermediate stages in the formation of a memory die stack attached to a backside of a logic die in accordance with some embodiments.

FIGS. 12 through 18 illustrate the cross-sectional views of intermediate stages in the formation of a die stack in accordance with alternative embodiments. These embodiments are similar to the embodiments as shown in FIGS. 1 through 10, 11A, and 11B, except that memory dies are attached to the front side (rather than the backside) of a device die. Referring to FIG. 12, device wafer 20, which includes device dies 20', is provided. The front side of device wafer 20 is shown as facing up, with interconnect structure 24 being over semiconductor substrate 22 and TSVs 26. As shown in FIG. 26, which shows some details of interconnect structure 24, in interconnect structure 24, electrical connectors 230 are covered by dielectric layer 232. A planarization process is then performed to thin dielectric layer 232, until electrical connectors 230 are exposed.

Figure 13:
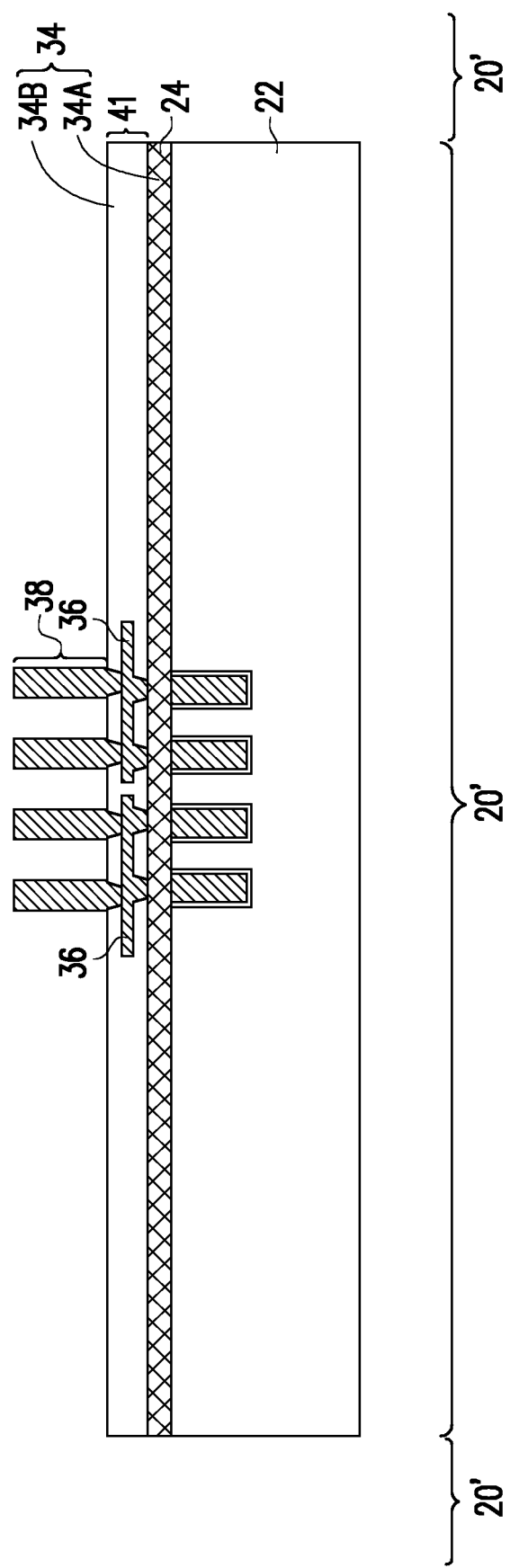

Next, referring to FIG. 13, a tier-1 redistribution structure 41 and metal posts 38 are formed. The formation processes and materials are essentially the same as discussed in the preceding embodiments, and are not repeated herein. Some redistribution lines 36 may be in physical contact with some of electrical connectors 230 as shown in FIG. 26.

Figure 14:
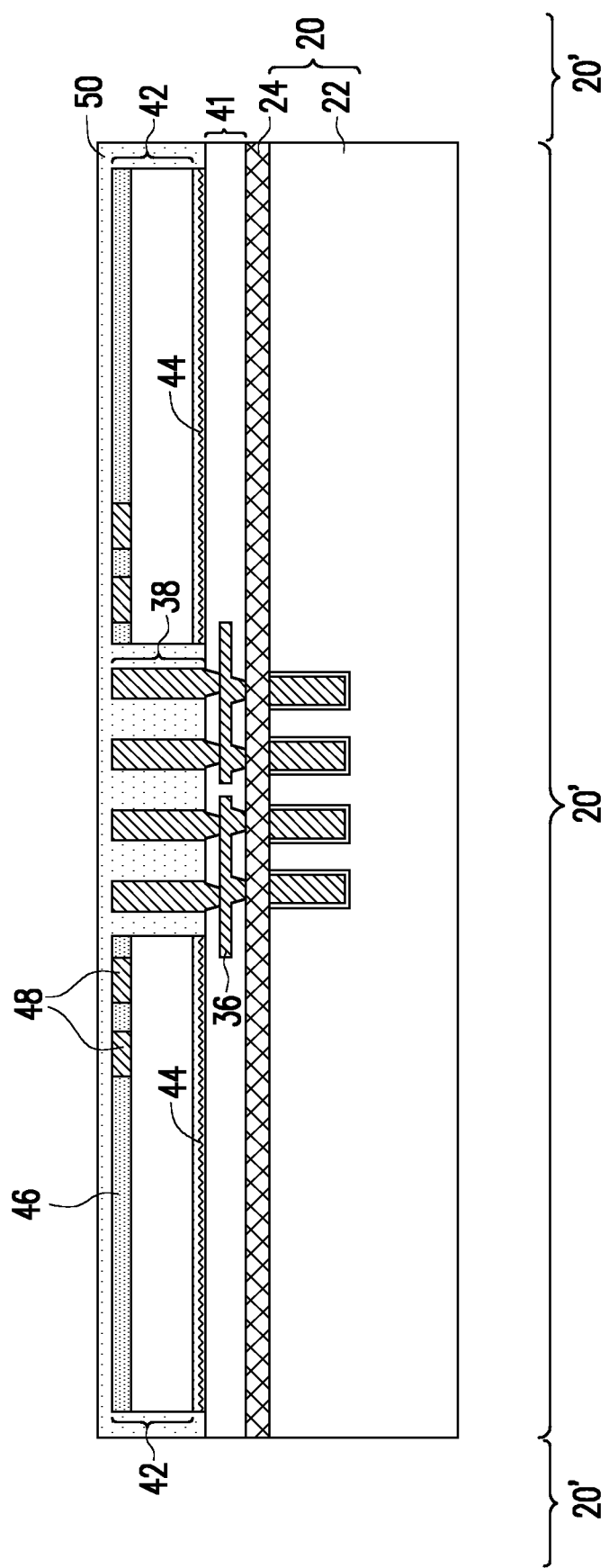
Figure 15:
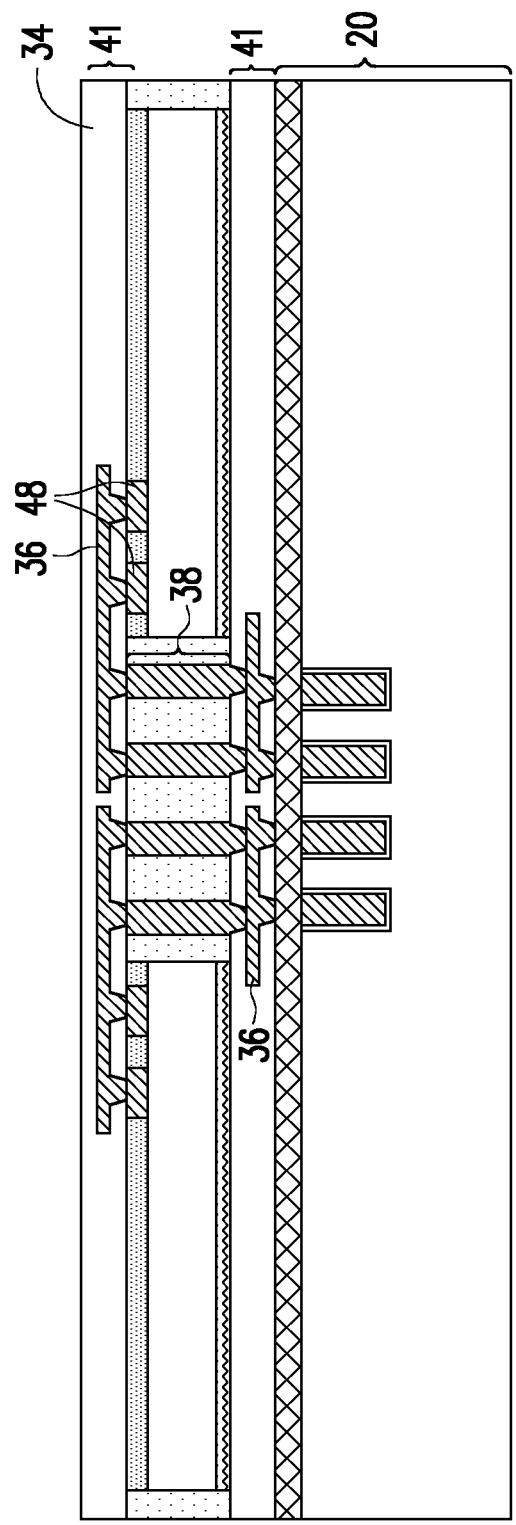

FIG. 14 illustrates the placement of tier-1 memory dies 42, and the encapsulation of memory dies 42 and metal posts 38 in encapsulant 50. A planarization process is then preformed on encapsulant 50 to reveal metal posts 38 and electrical connectors 48. Next, as shown in FIG. 15, tier-2 redistribution structure 41 is formed. In subsequent processes, more tiers of metal posts 38, encapsulant 50, and redistribution structures 41 are formed, and the resulting structure is shown in FIG. 16, which structure is referred to as reconstructed wafer 54 hereinafter.

Figure 16:
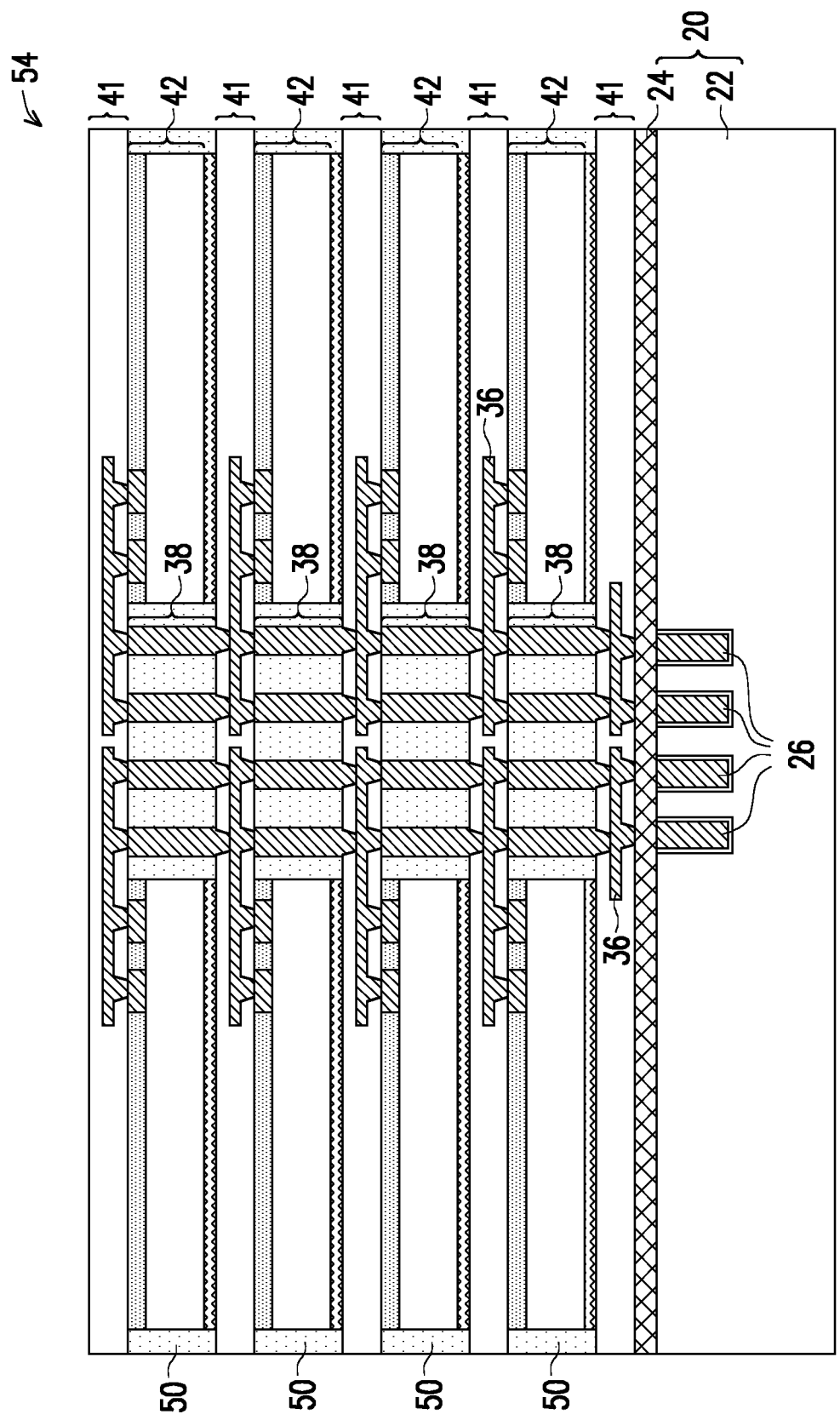
Figure 17:
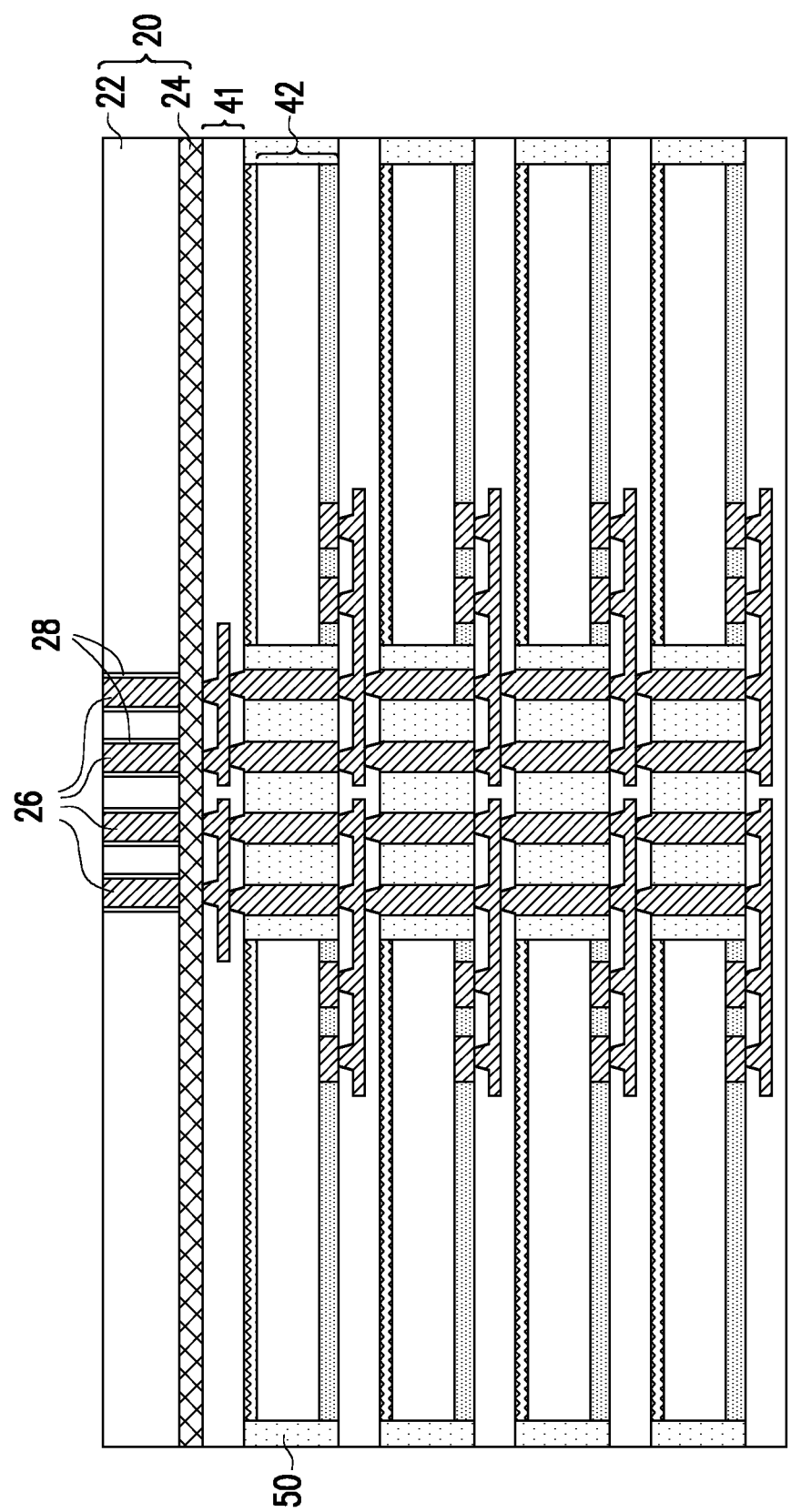
Figure 18:
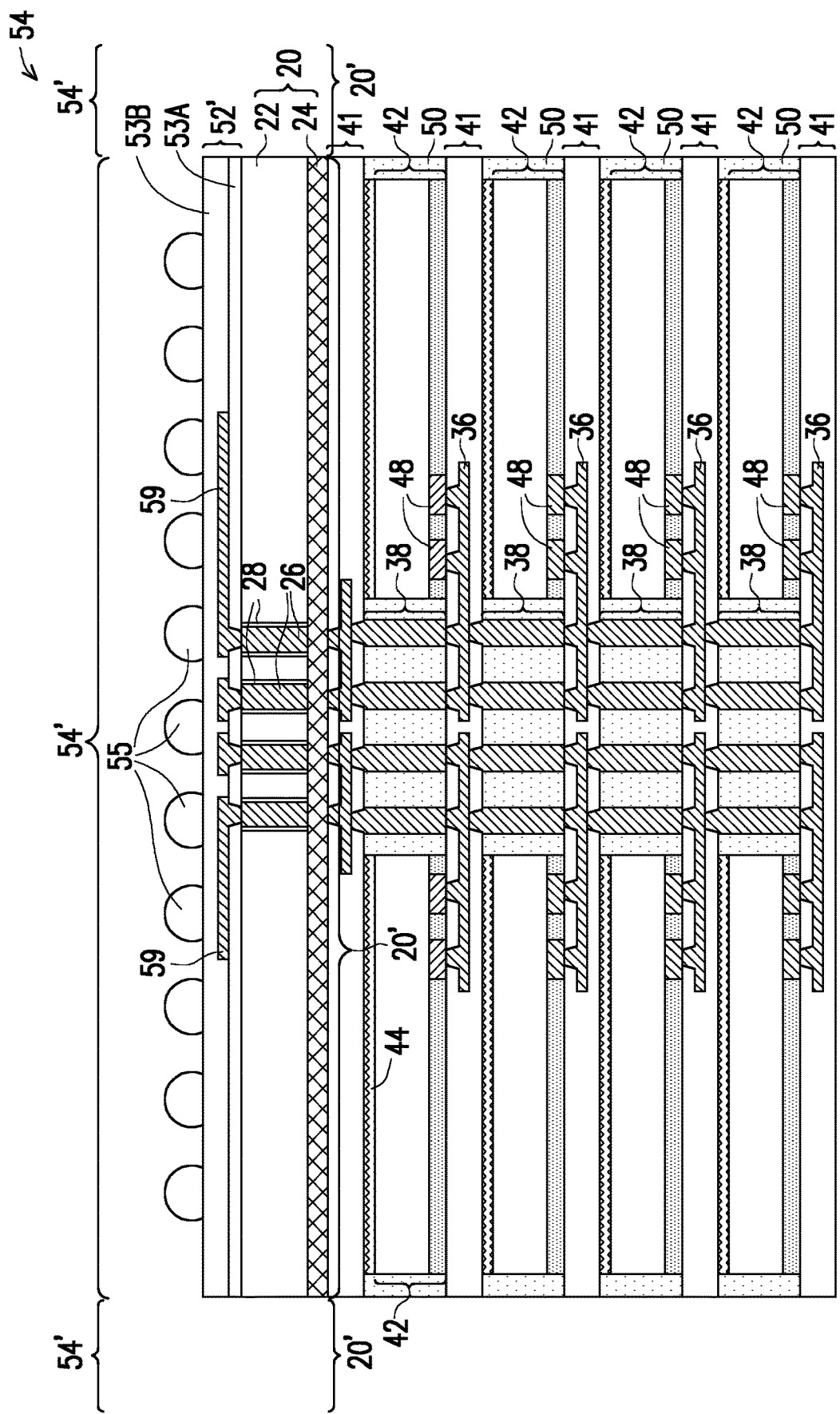

Referring to FIG. 17, which illustrates reconstructed wafer 54 as being flipped upside-down compared to FIG. 16, a planarization process such as a CMP process or a mechanical grinding process is performed, until TSVs 26 are exposed. Next, as shown in FIG. 18, redistribution structure 52' is formed on semiconductor substrate 22 of device die 20'. Redistribution structure 52' may be formed, for example, using the similar process and materials for forming redistribution structure 41. Redistribution structure 52' may include dielectric layers 53A and 53B, and redistribution lines 59 in dielectric layers 53A and 53B. In accordance with some embodiments of the present disclosure, dielectric layers 53A and 53B are formed of a polymer such as PBO or polyimide. Dielectric layers 53A may be in physical contact with both semiconductor substrate 22 and possibly TSVs 26. Electrical connectors 55 are then formed over redistribution structure 52', and are electrically connected to device die 20' through redistribution lines 59. Electrical connectors 55 may include metal pillars, solder regions, Under-Bump Metallurgies (UBMs), and/or the like. In subsequent processes, reconstructed wafer 54 is sawed apart in a singulation process into discrete packages 54', which may then be bonded to additional package components such as interposers, packages substrates, printed circuit boards, or the like, with an underfill being disposed therebetween.

FIGS. 19 through 25 illustrate the cross-sectional views of intermediate stages in the formation of a memory die stack and a corresponding package in accordance with alternative embodiments. These embodiments are similar to the embodiments as shown in FIGS. 1 through 18, except that a memory die stack is formed first, and then bonded to a logic die through a bonding process, rather than forming the memory die stack directly from the logic die/wafer.

Figure 19:
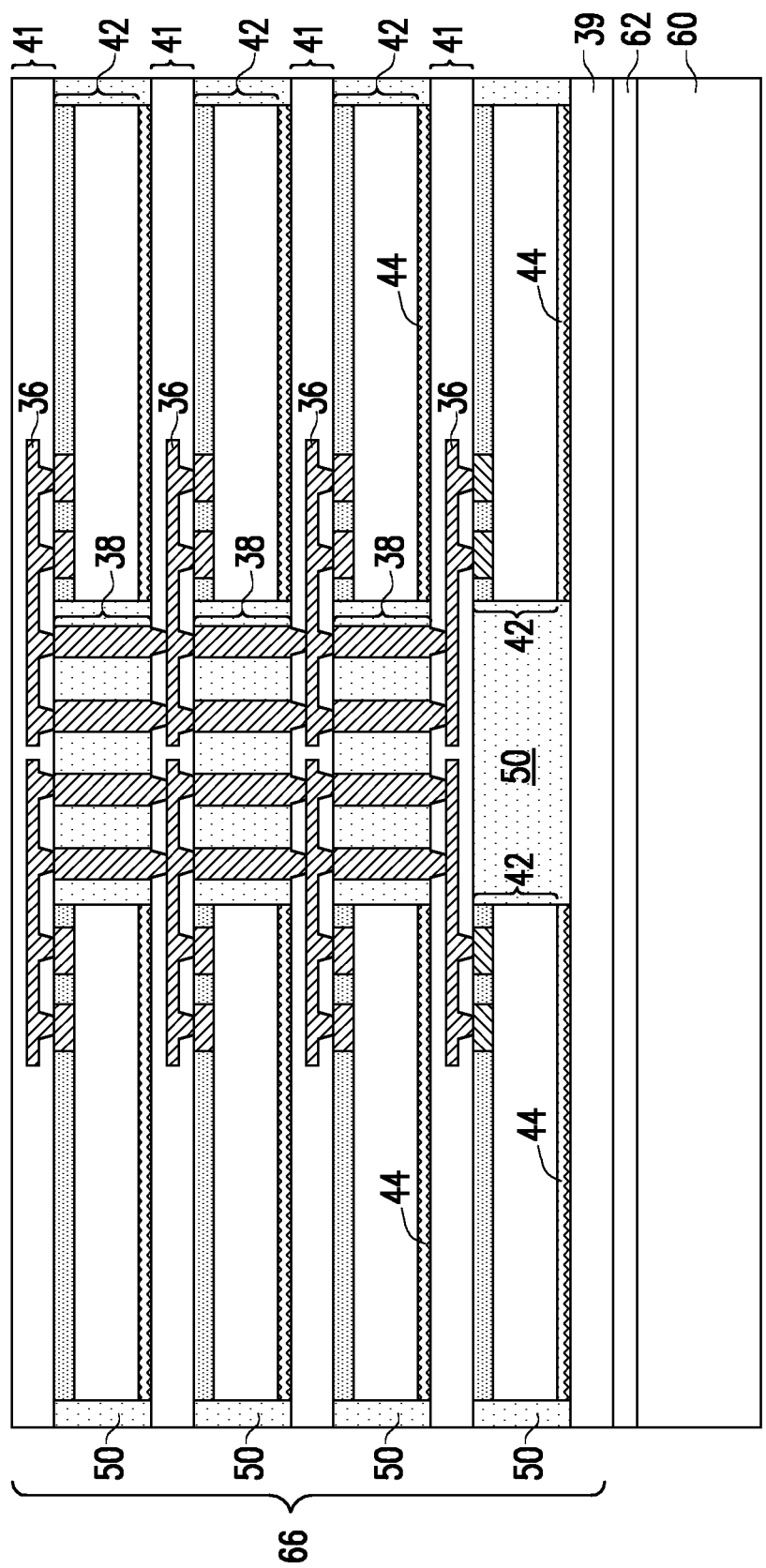
FIG. 19 through 25 illustrate the cross-sectional views of intermediate stages in the formation of a memory die stack, which is attached to a backside of a logic die, in accordance with some embodiments.
Figure 20:
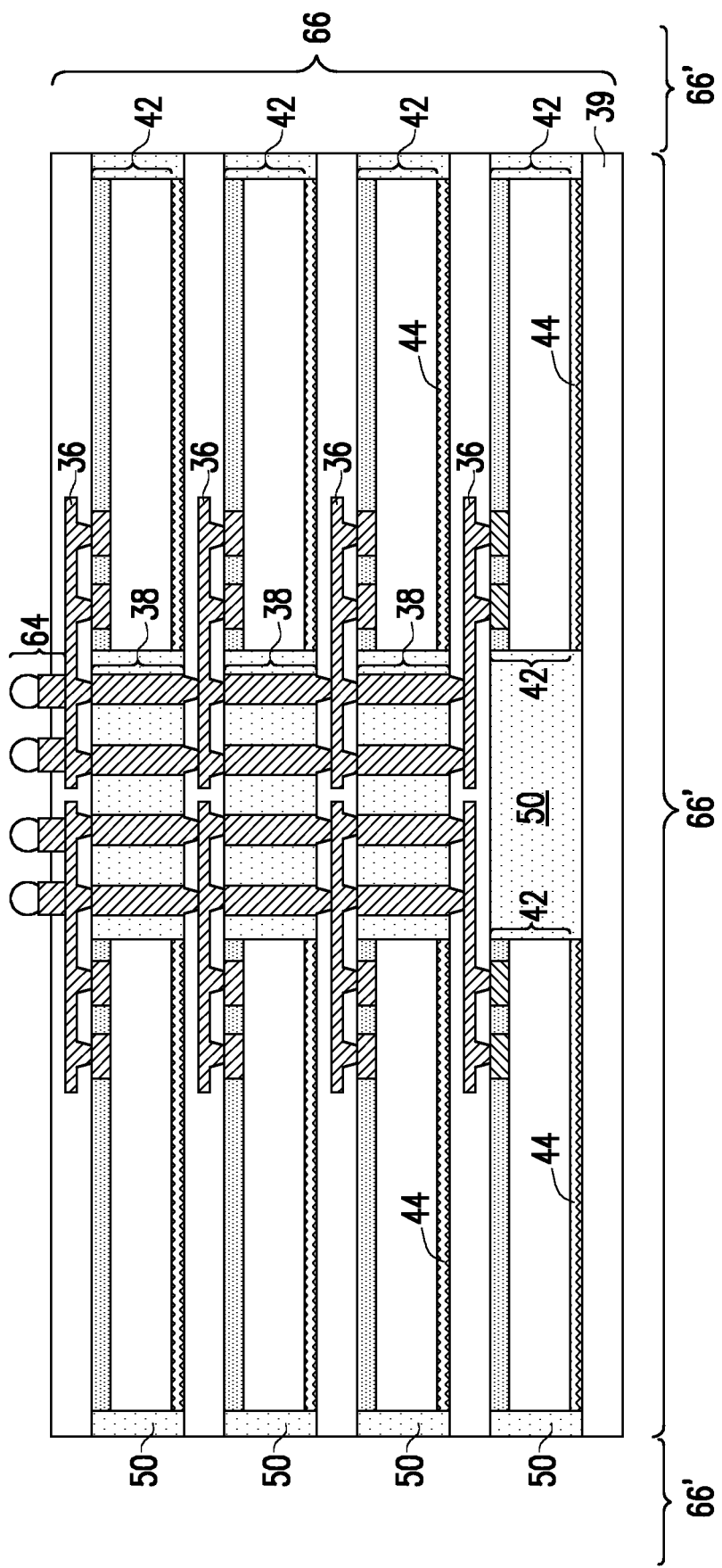

Referring to FIG. 19, carrier 60 is provided, with release film 62 formed thereon. A memory die stack 66 including memory dies 42, metal posts 38, encapsulant 50, and redistribution structures 41 are formed tier-by-tier. Memory die stack 66 may also include buffer dielectric 39, which may be formed of or include, for example, PBO or polyimide. The formation processes and the materials of the memory die stack 66 are similar to what are discussed referring to the embodiments shown in FIGS. 1 through 8, and are not repeated herein. It is appreciated that in the tier-1 encapsulant 50, through-vias 38 are not formed. Next, referring to FIG. 20, electrical connectors 64 are formed to electrically couple to the RDLs 38 and through-vias 38. Electrical connectors 64 may include metal pillars, metal pads, solder regions, and/or the like. Reconstructed wafer 66 is thus formed. In a subsequent process, reconstructed wafer 66 is de-bonded from carrier 60, followed by a singulation process to saw reconstructed wafer 66 into a plurality of memory stacks 66'.

Figure 21:
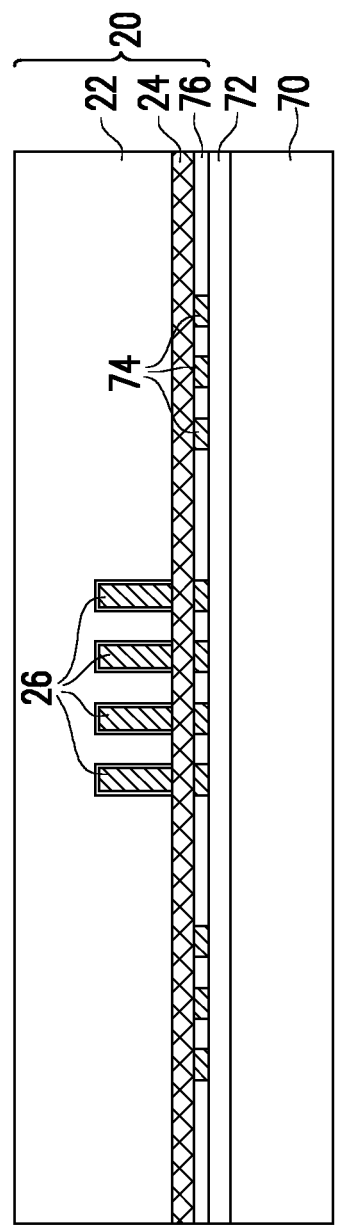

FIGS. 21 through 25 illustrate the bonding of memory stacks 66' to device wafer 20 (and device die 20'). Referring to FIG. 21, device wafer 20 is placed on carrier 70 through release film 72. Device wafer 20 has its front side facing down, and hence interconnect structure 24 is between semiconductor substrate 22 and carrier 70. In accordance with some embodiments, solder regions 74 (sometimes referred to as pre-solder regions) are pre-formed on interposer wafer 20, and may be formed in dielectric layer 76, which may be formed of or include a polymer such as PBO, polyimide, or the like. The solder regions 74 may be formed on, and possibly contacting, electrical connectors 230 as shown in FIG. 26. Alternatively, solder regions 74 may replace electrical connectors 230 as shown in FIG. 26.

Figure 22:
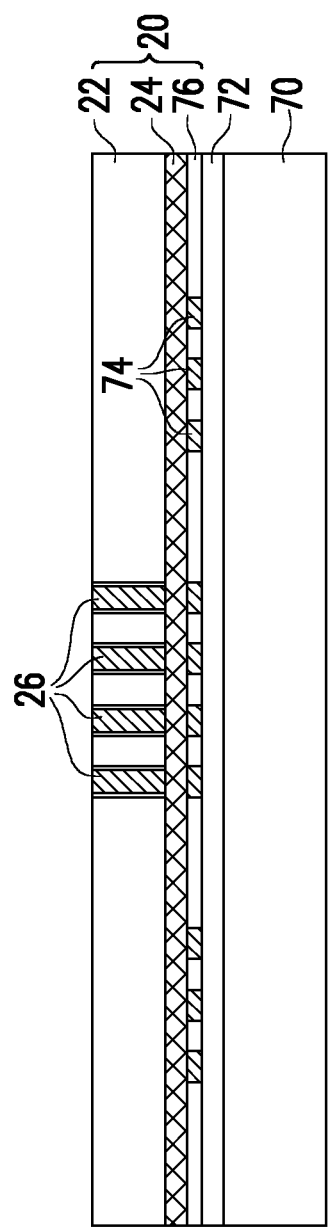
Figure 23:
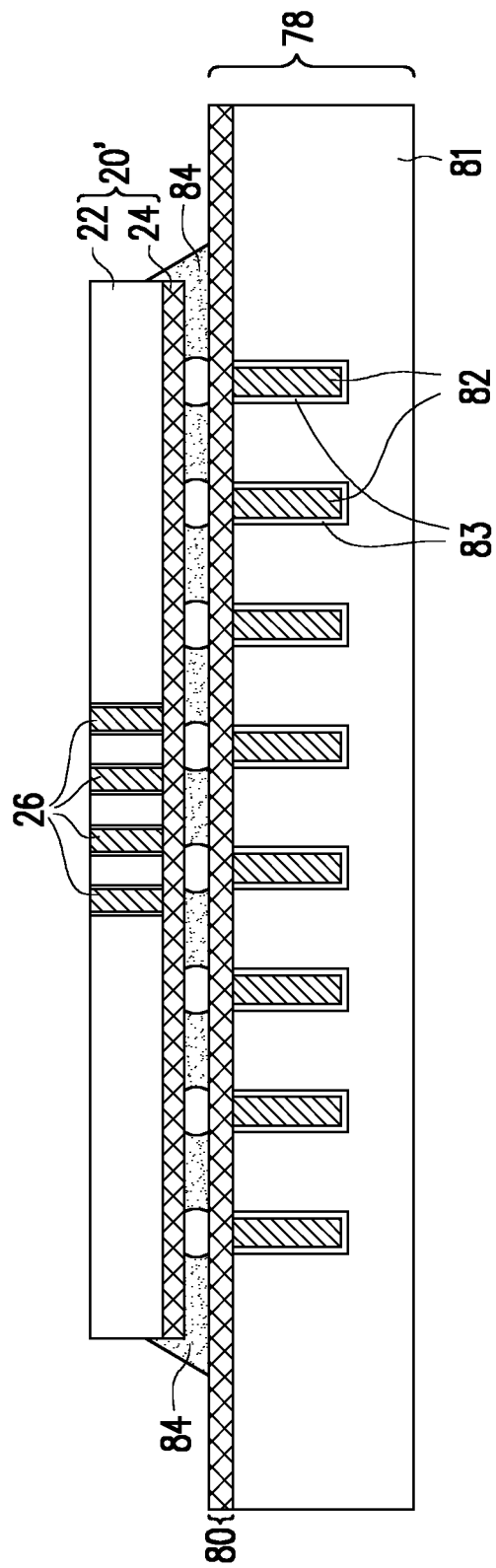

Next, as shown in FIG. 22, a planarization process such as a CMP process or a mechanical grinding process is performed on semiconductor substrate 22 to reveal TSVs 26. Device wafer 20 is than singulated to form device die 20', with one of the device die 20' being shown in FIG. 23. FIG. 23 also illustrates the bonding of device dies 20' onto interposer wafer 78 through solder regions 74. In accordance with some embodiments, interposer wafer 78 has a structure similar to device wafer 20 as shown in FIG. 26, except that interposer wafer 78 does not include integrated circuits 220 such as active devices therein. Interposer wafer 78 may include or may be free from passive devices such as resistors, capacitors, inductors, or the like therein. TSVs 82 are formed to extend into semiconductor substrate 81, which may be a semiconductor substrate such as a silicon substrate. Insulation liners 83 encircle TSVs 82. Interposer wafer 78 may include interconnect structure 80 at its front surface. The structure of the interconnect structure 80 is not shown, and may be similar to the interconnect structure 24 as shown in FIG. 26. In accordance with some embodiments of the present disclosure, the front side (the side having interconnect structure 80) of interposer wafer 78 faces up, as shown in FIG. 23. In accordance with alternative embodiments of the present disclosure, the front side of interposer wafer 78 faces down, and solder regions 74 may be directly bond to TSVs 82, which are exposed by polishing substrate 81 in interposer wafer 78. Underfill 84 is disposed between device die 20' and interposer wafer 78. Although one device die 20' is shown, a plurality of device dies 20' are placed on interposer wafer 78, for example, with each of plurality of device dies 20' overlapping one of the interposer dies in interposer wafer 78.

Figure 24:
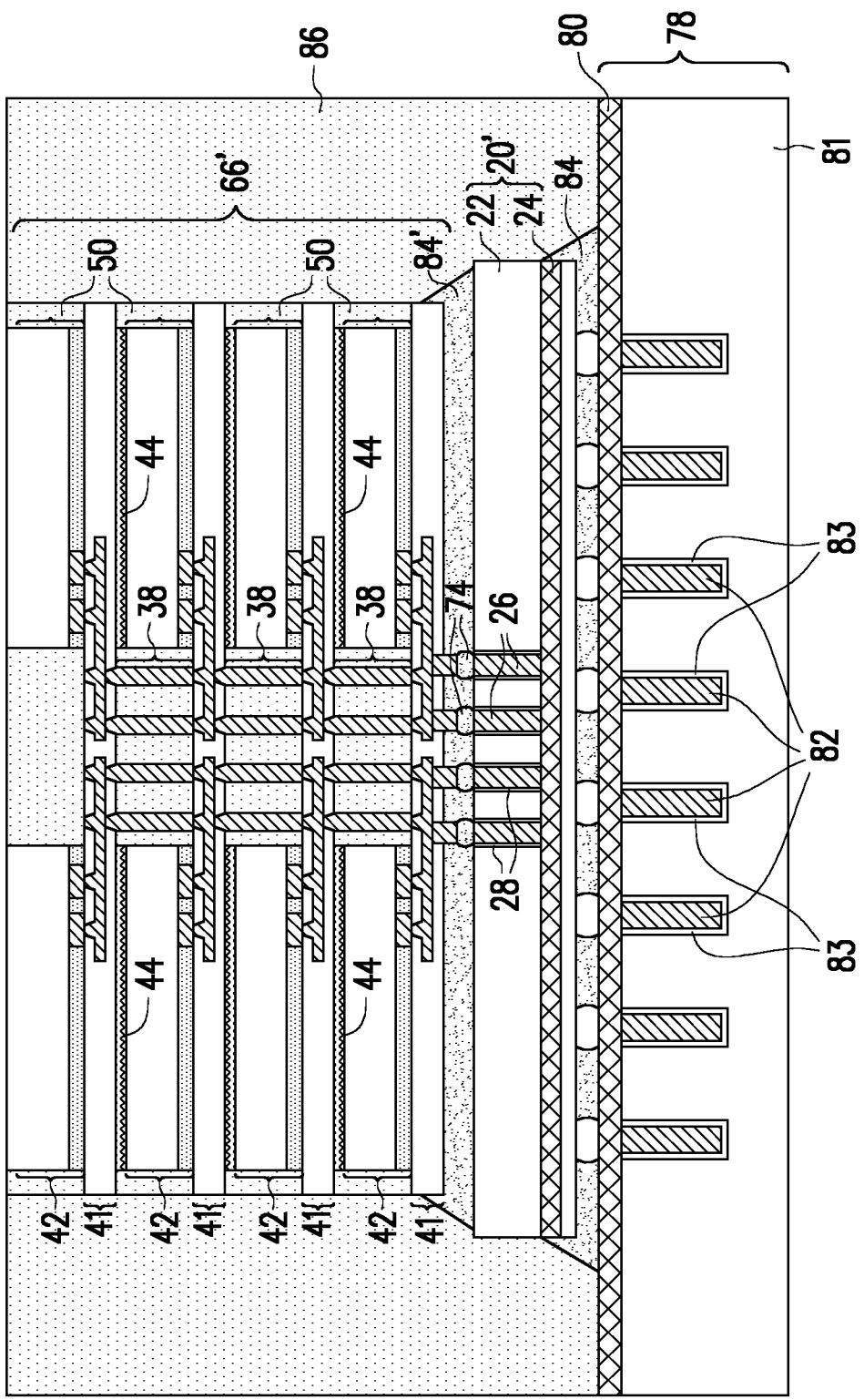

FIG. 24 illustrates the bonding of a plurality of memory stacks 66', each onto one of device dies 20'. Underfill 84' is disposed between memory stack 66' and device die 20'. Encapsulant 86, for example, a molding compound, an epoxy, or the like, is encapsulated on memory stacks 66' and device dies 20' to form reconstructed wafer 88. Encapsulant 86 may also include a base material and spherical fillers in the base material.

Figure 25:
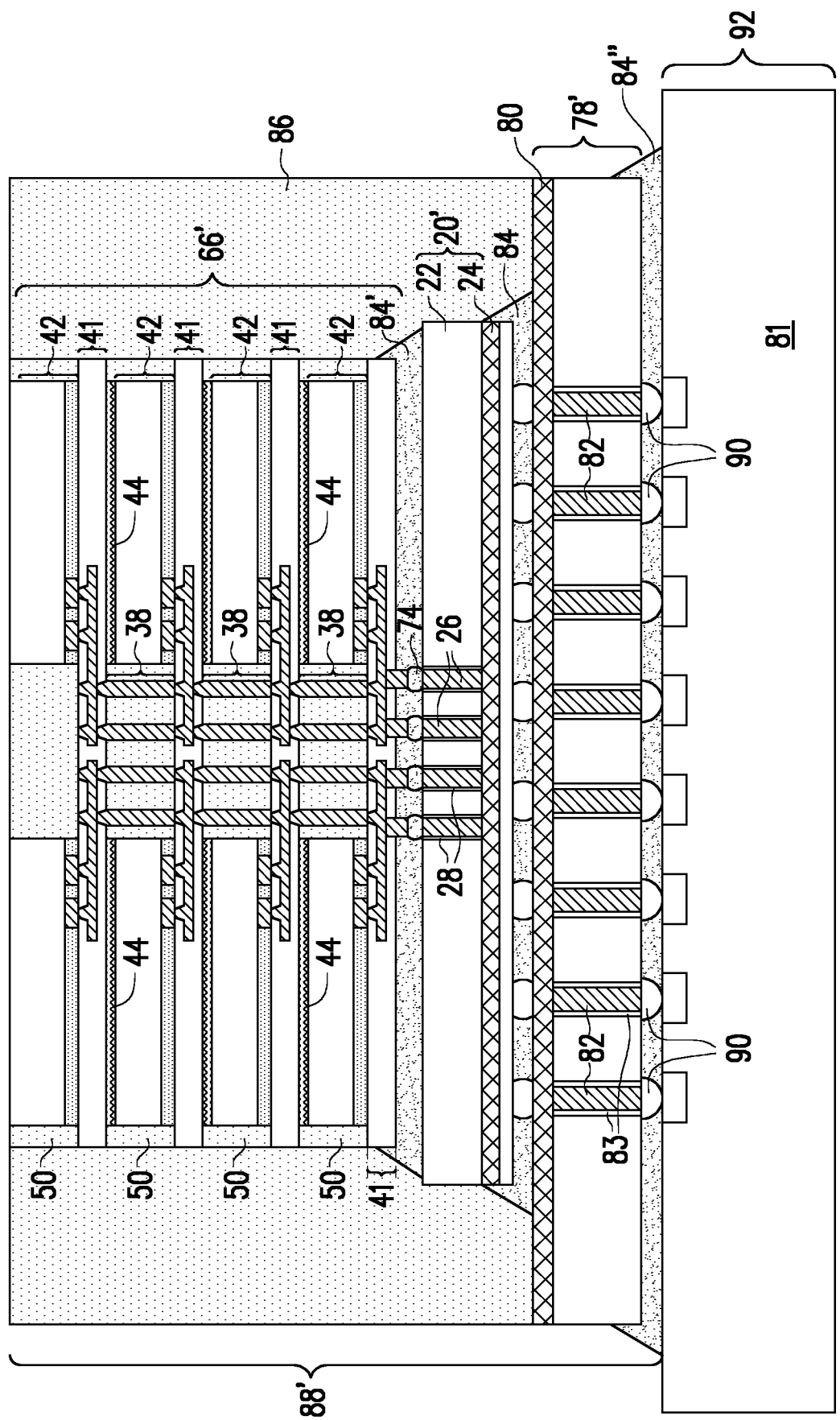

In a subsequent process, interposer wafer 78 is polished to thin semiconductor substrate 81, revealing TSVs 82. Solder regions 90 (FIG. 25) may be formed on TSVs 82. Alternative, another redistribution structure may be formed to connect solder regions 90 to TSVs 82. The reconstructed wafer 88 may then be sawed to form a plurality of packages 88'. Interposer wafer 78 is sawed into interposer dies, with one of interposer dies 78' shown in FIG. 25. FIG. 25 also illustrates the bonding of package 88' to a package component 92, which may be a package substrate, a frame, a printed circuit board, or the like.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By forming redistribution lines directly from device dies (such as logic dies) and/or memory dies, the interconnection between the logic dies and memory dies is made through RDLs that are formed directly from device dies and memory dies, rather than through metal bumps or solder regions. The height of the resulting package is reduced due to the removed metal bumps and solder regions, allowing more memory dies to be stacked in a same height. Also, through-vias are formed in encapsulant materials rather than in semiconductor substrates of the memory dies. Accordingly, the loading resulted from the parasitic capacitance between the TSVs in memory dies and the semiconductor substrates is eliminated. Since memory dies often occupy a smaller footprint than the underlying device die, the formation of the through-vias in an encapsulant do not cause the increase in the occupied area of the package.

In accordance with some embodiments of the present disclosure, a method includes forming a memory die stack comprising placing a first memory die on a lower dielectric layer; forming a first plurality of metal posts over the lower dielectric layer; encapsulating the first memory die in a first encapsulant; forming a first redistribution structure comprising forming a first plurality of dielectric layers over the first encapsulant; and forming a first plurality of redistribution lines in the first plurality of dielectric layers, wherein the first plurality of redistribution lines are electrically connected to the first plurality of metal posts and the first memory die; placing a second memory die over the first redistribution structure; forming a second plurality of metal posts over the first redistribution structure, wherein the second plurality of metal posts are electrically connected to the first plurality of metal posts; encapsulating the second memory die in a second encapsulant; forming a second redistribution structure comprising forming a second plurality of dielectric layers over the second encapsulant; and forming a second plurality of redistribution lines in the second plurality of dielectric layers, wherein the second plurality of redistribution lines are electrically connected to the second plurality of metal posts and the second memory die. In an embodiment, the first memory die and the second memory die are free from through-substrate vias therein. In an embodiment, the first memory die is placed on the lower dielectric layer through a first adhesive film, and the second memory die is placed on the second redistribution structure through a second adhesive film. In an embodiment, the method further includes forming an additional redistribution structure comprising forming an additional plurality of dielectric layers over a device die comprising a semiconductor substrate and through-vias in the semiconductor substrate, wherein the lower dielectric layer is comprised in the additional plurality of dielectric layers; and forming an additional plurality of redistribution lines in the additional plurality of dielectric layers, wherein the additional plurality of redistribution lines are electrically connected to the through-vias. In an embodiment, the additional redistribution structure is formed on a front side of the device die, and the device die comprises electrical connectors on the front side, and a first polymer layer encapsulating the electrical connectors therein. In an embodiment, the forming the additional redistribution structure comprises thinning the first polymer layer to reveal the electrical connectors; and disposing a second polymer layer over and contacting the electrical connectors and the first polymer layer, wherein the second polymer layer is comprised in the additional plurality of dielectric layers. In an embodiment, the additional redistribution structure is formed on a back side of the device die. In an embodiment, the forming the additional redistribution structure comprises thinning the semiconductor substrate of the device die to reveal the through-vias; and disposing a polymer layer over and contacting both the through-vias and the semiconductor substrate, wherein the polymer layer is comprised in the additional plurality of dielectric layers. In an embodiment, the method further includes bonding the memory die stack on a device die, wherein the first plurality of metal posts are electrically connected to through-vias in a semiconductor substrate of the device die.

In accordance with some embodiments of the present disclosure, a method includes thinning a semiconductor substrate of a device die to reveal through-substrate vias that extend into the semiconductor substrate; forming a first redistribution structure comprising forming a first plurality of dielectric layers over the semiconductor substrate; and forming a first plurality of redistribution lines in the first plurality of dielectric layers, wherein the first plurality of redistribution lines are electrically connected to the through-substrate vias; placing a first memory die over the first redistribution structure; forming a first plurality of metal posts over the first redistribution structure, wherein the first plurality of metal posts are electrically connected to the first plurality of redistribution lines; encapsulating the first memory die in a first encapsulant; and forming a second plurality of redistribution lines over, and electrically connected to, the first plurality of metal posts and the first memory die. In an embodiment, the method further includes forming a second redistribution structure comprising forming a second plurality of dielectric layers over the first encapsulant, wherein the second plurality of redistribution lines are in the second plurality of dielectric layers. In an embodiment, a bottom dielectric layer in the first plurality of dielectric layers are in physical contact with the semiconductor substrate and the through-substrate vias. In an embodiment, the through-substrate vias are separated from the semiconductor substrate by insulation liners, and the bottom dielectric layer is further in contact with the insulation liners. In an embodiment, the forming the first plurality of dielectric layers comprises forming a plurality of polymer layers. In an embodiment, the first memory die comprises an additional semiconductor substrate, and the first memory die is free from through-vias in the additional semiconductor substrate.

In accordance with some embodiments of the present disclosure, an integrated circuit structure includes a device die. The device die includes a semiconductor substrate; a plurality of through-substrate vias penetrating through the semiconductor substrate; and an interconnect structure on a side of the semiconductor substrate; a first redistribution structure over the device die and comprising a first plurality of dielectric layers; and a first plurality of redistribution lines in the first plurality of dielectric layers, wherein the first plurality of redistribution lines are electrically coupled to the device die. The integrated circuit structure further includes a first memory die over the first redistribution structure; a first plurality of metal posts over the first redistribution structure, wherein the first plurality of metal posts are electrically connected to the first plurality of redistribution lines; a first encapsulant encapsulating the first memory die and the first plurality of metal posts therein; and a second plurality of redistribution lines over the first encapsulant and electrically connected to the first memory die and the first plurality of metal posts. In an embodiment, the first memory die comprises an additional semiconductor substrate, and the first memory die is free from through-vias penetrating through the additional semiconductor substrate. In an embodiment, the integrated circuit structure further includes a second memory die over and electrically connected to the first plurality of metal posts. In an embodiment, the first plurality of dielectric layers comprise a bottom dielectric layer in physical contact with the semiconductor substrate of the device die. In an embodiment, the interconnect structure is between the first redistribution structure and the semiconductor substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a stacked structure, wherein forming the stacked structure comprising:
   stacking a plurality of device dies as a die stack;
   forming a plurality of through-vias, with overlying ones of the plurality of through-vias being electrically connecting to respective underlying ones of the plurality of through-vias;
   forming a plurality of encapsulant regions, each encapsulating one of the plurality of device dies; and
   forming a plurality of redistribution structures, each overlying and contacting one of the plurality of encapsulant regions, a corresponding one of the plurality of device dies, and a corresponding one of the plurality of through-vias, wherein the plurality of redistribution structures comprise a redistribution line comprising a first via physically contacting a metal pad of a device die in the plurality of device dies, and a second via physically contacting one of the plurality of through-vias; and electrically connecting the stacked structure to a bottom die, wherein each of the plurality of device dies is electrically connected to the bottom die through the plurality of through-vias and corresponding ones of the plurality of redistribution structures.

2. The method of claim 1, wherein the plurality of device dies are free from through-substrate vias therein.

3. The method of claim 1, wherein the plurality of device dies are memory dies that have an identical structure.

4. The method of claim 1, wherein the forming the stacked structure comprises:

forming one of the plurality of through-vias, wherein the one of the plurality of through-vias protruding higher than underlying components;

placing one of the plurality of device dies over the underlying components; and encapsulating the one of the plurality of through-vias and the one of the plurality of device dies in one of the plurality of encapsulant regions.

5. The method of claim 1, wherein the plurality of device dies are distributed on opposite sides of the plurality of through-vias.

6. The method of claim 1, wherein the plurality of through-vias are distributed on opposite sides of the plurality of device dies.

7. The method of claim 1, wherein the electrically connecting the stacked structure to the bottom die comprises building the stacked structure layer-by-layer starting from a device wafer, wherein the bottom die is comprised in the device wafer.

8. The method of claim 1, wherein the stacked structure is pre-formed before the stacked structure is bonded to the bottom die.

9. The method of claim 1, wherein the forming the plurality of redistribution structures comprises:

forming a dielectric layer over and contacting a device die in the plurality of device dies, wherein the dielectric layer is over and contacting an encapsulant in the plurality of encapsulant regions; and forming a plurality of redistribution lines extending into the dielectric layer to electrically connect the device die to corresponding ones of the plurality of through-vias.

10. The method of claim 1, wherein one of the plurality of device dies is in a package that further comprises:

an additional through-via over and contacting the one of the plurality of device dies;

an additional die over and attached to the one of the plurality of device dies; and a molding compound molding the additional through-via and the additional die therein.

11. A method comprising:

forming a first redistribution structure over and electrically connecting to a bottom wafer, wherein the wafer comprises transistors therein;

placing a first device die over the first redistribution structure;

forming a first plurality of metal posts over and electrically connected to the first redistribution structure;

forming a second redistribution structure over and electrically connected to the first plurality of metal posts and the first device die;

placing a second device die over the second redistribution structure;

forming a second plurality of metal posts over the second redistribution structure, wherein the second plurality of metal posts are electrically connected to the first plurality of metal posts to form a plurality of vertical electrical channels;

forming a third redistribution structure over, and electrically connected to, the second plurality of metal posts and the second device die, wherein both of the first device die and the second device die are electrically connected to the bottom wafer through the plurality of vertical electrical channels; and sawing the wafer, the first redistribution structure, the second redistribution structure, and the third redistribution structure to form a plurality of packages.

12. The method of claim 11, wherein the first device die and the second device die share same ones of the plurality of vertical electrical channels to electrically connect to a bottom die in the bottom wafer.

13. The method of claim 11 further comprising performing a singulation process to cut the bottom wafer, the first redistribution structure, the second redistribution structure, and the third redistribution structure into a plurality of identical packages, wherein one of the plurality of identical packages comprises a bottom die in the bottom wafer, the first device die, and the second device die.

14. The method of claim 11, wherein the bottom wafer comprises:

a semiconductor substrate; and a plurality of through-substrate vias in the semiconductor substrate, wherein the first redistribution structure is over and in physical contact with the plurality of through-substrate vias.

15. The method of claim 14, wherein the plurality of through-substrate vias are separated from the semiconductor substrate by insulation liners, and the first redistribution structure is further in direct contact with the insulation liners.

16. The method of claim 11, wherein the forming the first redistribution structure comprises:

forming a polymer layer, and forming a plurality of redistribution lines extending into the polymer layer to contact the bottom wafer.

17. The method of claim 11, wherein the first device die is placed over the first redistribution structure through a die-attach film.

18. A method comprising:

forming a plurality of through-vias, wherein overlying one of the plurality of through-vias are over and electrically connected to underlying ones of the plurality of through-vias to form a vertical electrical channel;

stacking a plurality of device dies to form a die stack; and forming a plurality of redistribution structures, wherein each of the plurality of redistribution structures is overlying one of the plurality of device dies, and wherein the plurality of redistribution structures laterally connect the vertical electrical channel to each of the plurality of device dies, and wherein a topmost through-via of the plurality of through-vias comprises a first top surface coplanar with a second top surface of a topmost device die of the plurality of device dies.

19. The method of claim 18, wherein the stacking the plurality of device dies comprises attaching the plurality of device dies to corresponding underlying components through die-attach films.

20. The method of claim 18 further comprising:
dispensing a plurality of molding compounds, wherein each of the plurality of device dies is encapsulated in one of the plurality of molding compounds.

* * * * *